(12) United States Patent
Yoo et al.

(10) Patent No.: US 10,203,909 B2
(45) Date of Patent: Feb. 12, 2019

(54) NONVOLATILE MEMORY MODULES COMPRISING VOLATILE MEMORY DEVICES AND NONVOLATILE MEMORY DEVICES

(71) Applicant: Samsung Electronics Co., Ltd., Suwon-si, Gyeonggi-do (KR)

(72) Inventors: Youngkwang Yoo, Yongin-si (KR); Youngjin Cho, Seoul (KR); Han-Ju Lee, Hwaseong-si (KR); JinHyeok Choi, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 158 days.

(21) Appl. No.: 15/421,514

(22) Filed: Feb. 1, 2017

(65) Prior Publication Data

US 2017/0235524 A1    Aug. 17, 2017

(30) Foreign Application Priority Data

Feb. 15, 2016    (KR) ........................ 10-2016-0017337

(51) Int. Cl.
| | |
|---|---|
| *G06F 3/06* | (2006.01) |
| *G11C 8/12* | (2006.01) |
| *G06F 12/0868* | (2016.01) |

(52) U.S. Cl.
CPC .......... *G06F 3/0659* (2013.01); *G06F 3/0611* (2013.01); *G06F 3/0685* (2013.01); *G06F 12/0868* (2013.01); *G11C 8/12* (2013.01); *G06F 2212/1016* (2013.01); *G06F 2212/202* (2013.01); *G11C 2207/2245* (2013.01)

(58) Field of Classification Search
CPC .... G06F 3/0611; G06F 3/0659; G06F 3/0685; G06F 12/0868; G06F 2212/1016; G06F 2212/202; G11C 8/12; G11C 2207/2245
See application file for complete search history.

(56) References Cited

U.S. PATENT DOCUMENTS

| | | | |
|---|---|---|---|
| 5,835,945 A | 11/1998 | King et al. | |
| 6,279,081 B1 * | 8/2001 | Spencer | ............. G06F 12/0862 711/117 |
| 7,679,133 B2 | 3/2010 | Son et al. | |
| 7,830,732 B2 | 11/2010 | Moshayedi et al. | |
| 8,553,466 B2 | 10/2013 | Han et al. | |
| 8,559,235 B2 | 10/2013 | Yoon et al. | |

(Continued)

*Primary Examiner* — Harry W Byrne
*Assistant Examiner* — R Lance Reidlinger
(74) *Attorney, Agent, or Firm* — Myers Bigel, P.A.

(57) ABSTRACT

A nonvolatile memory module may include a nonvolatile memory device, a nonvolatile memory controller configured to control the nonvolatile memory device, a volatile memory device configured as a cache memory of the nonvolatile memory device, and a module controller configured to receive a command and an address from an external device, external to the nonvolatile memory module, and to send a volatile memory command and a volatile memory address to the volatile memory device through a first bus and a nonvolatile memory command and a nonvolatile memory address to the controller through a second bus in response to the received command and address. The volatile memory device is configured to load two or more cache data on each of two or more memory data line groups and two or more tags on each of two or more tag data line groups in response to the volatile memory address.

20 Claims, 24 Drawing Sheets

(56) References Cited

U.S. PATENT DOCUMENTS

| | | |
|---|---|---|
| 8,654,587 B2 | 2/2014 | Yoon et al. |
| 8,874,831 B2 | 10/2014 | Lee et al. |
| 8,904,099 B2 | 12/2014 | Chen et al. |
| 8,949,502 B2 | 2/2015 | McKnight et al. |
| 2010/0125695 A1* | 5/2010 | Wu .................... G06F 3/0613 711/103 |
| 2011/0233648 A1 | 9/2011 | Seol et al. |
| 2014/0013025 A1 | 1/2014 | Jannyavula Venkata |
| 2014/0181364 A1 | 6/2014 | Berke et al. |
| 2014/0244914 A1 | 8/2014 | Tzeng |
| 2014/0337539 A1 | 11/2014 | Lee et al. |
| 2015/0016192 A1 | 1/2015 | Rategh et al. |

\* cited by examiner

NONVOLATILE MEMORY MODULES COMPRISING VOLATILE MEMORY DEVICES AND NONVOLATILE MEMORY DEVICES

CROSS-REFERENCE TO RELATED APPLICATIONS

A claim for priority under 35 U.S.C. § 119 is made to Korean Patent Application No. 10-2016-0017337 filed on Feb. 15, 2016, in the Korean Intellectual Property Office, the entire contents of which are hereby incorporated herein by reference.

BACKGROUND

The inventive concepts relate to semiconductor memory, and more particularly, to nonvolatile memory modules including volatile memory devices and nonvolatile memory devices.

Semiconductor memory devices may be memory devices that are implemented by using semiconductors such as silicon (Si), germanium (Ge), gallium arsenide (GaAs), indium phosphide (InP), etc. Semiconductor memory devices may be classified as volatile memory devices and/or nonvolatile memory devices.

Volatile memory devices may be memory devices which lose data stored therein when power is removed from the device. Volatile memory devices may include, for example, static random access memory (SRAM), dynamic RAM (DRAM), synchronous DRAM, etc. Nonvolatile memory devices may be memory devices which retain data stored therein even when power is removed from the device. Nonvolatile memory devices may include, for example, read only memory (ROM), programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), ferroelectric RAM (FRAM), etc.

Since the response and operation speed of DRAM can be fast, DRAM is often used as a main memory of a system. However, since DRAM is a volatile memory in which data may be lost when a power is shut off, a separate device may be used to retain data stored in the DRAM. In addition, since DRAM may store data by using capacitors, the size of a unit cell of DRAM may be large, thereby making it difficult to increase DRAM capacity when space is restricted.

SUMMARY

Embodiments of the inventive concepts provide nonvolatile memory modules having a large capacity and high performance by using nonvolatile memory and volatile memory.

One aspect of embodiments of the inventive concepts is directed to provide a nonvolatile memory module which includes a nonvolatile memory device, a nonvolatile memory controller configured to control the nonvolatile memory device, a volatile memory device configured as a cache memory of the nonvolatile memory device, and a module controller configured to receive a module command and a module address from an external device external to the nonvolatile memory module and to send a volatile memory command and a volatile memory address to the volatile memory device through a first bus and a nonvolatile memory command and a nonvolatile memory address to the nonvolatile memory controller through a second bus in response to the received module command and module address. The volatile memory device is configured to load two or more cache data on each of two or more memory data line groups and two or more tags on each of two or more tag data line groups in response to the nonvolatile memory address.

Another aspect of embodiments of the inventive concepts is directed to provide a nonvolatile memory module which includes a nonvolatile memory device, a nonvolatile memory controller configured to control the nonvolatile memory device, a volatile memory device configured as a cache memory of the nonvolatile memory device, a module controller configured to receive a module command and a module address from an external device external to the nonvolatile memory module and to send a volatile memory command and a volatile memory address to the volatile memory device through a first bus and a nonvolatile memory command and a nonvolatile memory address to the nonvolatile memory controller through a second bus in response to the received module command and module address, and a data buffer configured to exchange data with the external device through data lines and exchange data with the controller and the volatile memory device through two or more memory data line groups. The volatile memory device is configured to communicate with the module controller and the nonvolatile memory controller through two or more tag data line groups corresponding to the two or more memory data line groups, respectively, and the volatile memory device forms a set associative memory, which has two or more ways, with respect to the nonvolatile memory device based on the two or more memory data line groups and the two or more tag data line groups.

Another aspect of embodiments of the inventive concepts is directed to provide a nonvolatile memory module which includes a nonvolatile memory device, a volatile memory device connected to the nonvolatile memory device and configured to cache data for the nonvolatile memory device in a plurality of regions of the volatile memory device, a module controller connected to the volatile memory device and configured to receive a module command and a module address, and responsive to receiving the module command and the module address, send a volatile memory command and a volatile memory address to the volatile memory device, a plurality of tag data line groups, respective ones of the tag data line groups corresponding to respective ones of the plurality of regions of the volatile memory device, and a plurality of cache data line groups, respective ones of the cache data line groups corresponding to respective ones of the plurality of regions of the volatile memory device. Responsive to receiving the volatile memory command and the volatile memory address, the volatile memory device may be configured to transmit cache data from each one of the plurality of regions of the volatile memory device on corresponding ones of the plurality of cache data line groups, and transmit tag data from each one of the plurality of regions of the volatile memory device on corresponding ones of the plurality of tag data line groups. The module controller may be configured to determine that a cache hit is present for a region of the plurality of regions of the volatile memory device based on a comparison of the module address to the volatile memory address and tag data from a tag data line group of the plurality of tag data line groups that corresponds to the region.

BRIEF DESCRIPTION OF THE FIGURES

The above and other objects and features of the inventive concepts will become apparent from the following description with reference to the following figures, wherein like reference numerals refer to like parts throughout the various figures unless otherwise specified, and wherein.

DETAILED DESCRIPTION

Now hereinafter will be described embodiments of the inventive concepts in conjunction with the accompanying drawings. In the following description, details such as detailed configurations and structures are for helping understand embodiments of the inventive concepts overall.

Figure 1:
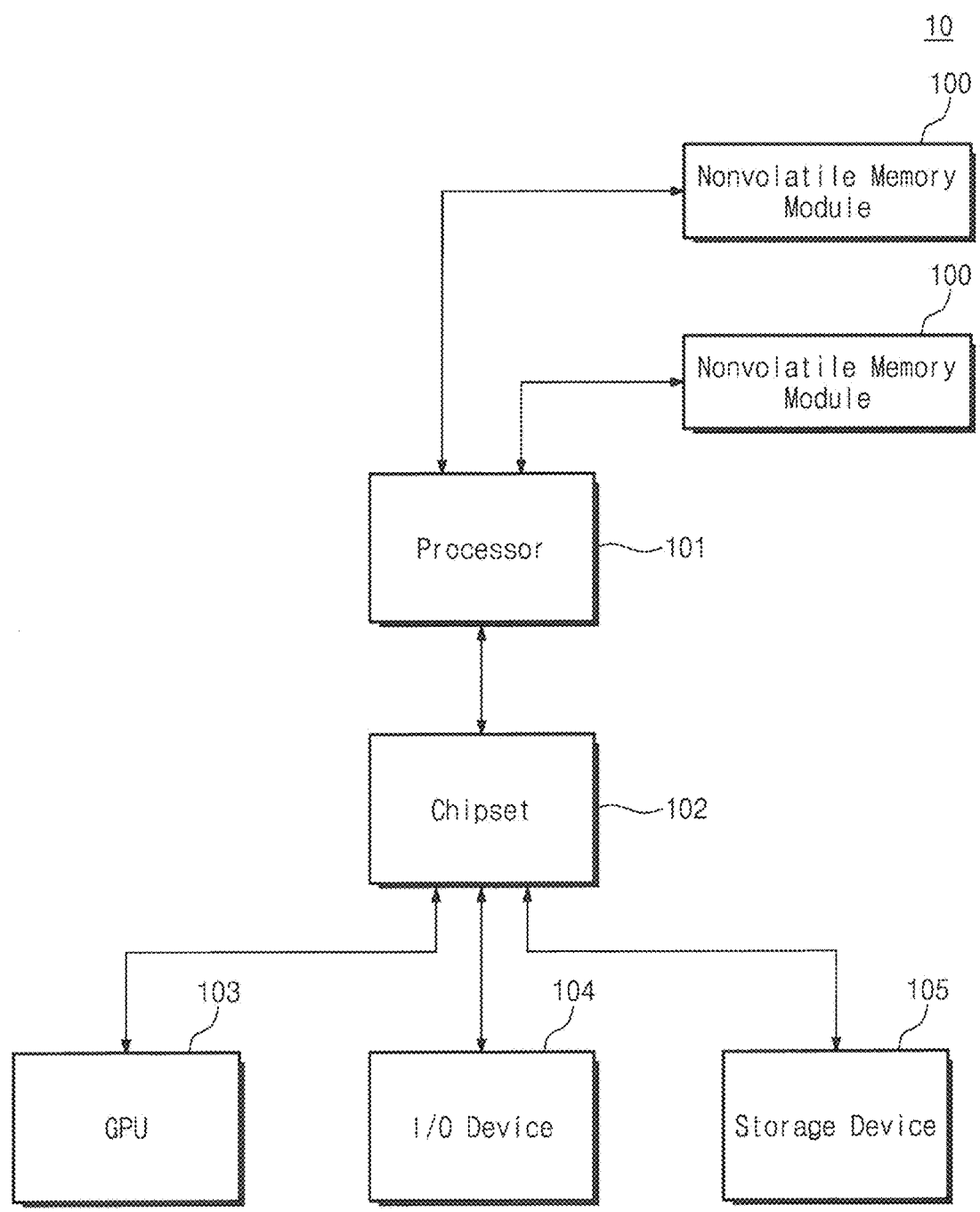
FIG. 1 is a block diagram illustrating a user system according to embodiments of the inventive concepts.

FIG. 1 is a block diagram illustrating a user system according to embodiments of the inventive concepts. Referring to FIG. 1, the user system 10 includes nonvolatile memory modules 100, a processor 101, a chipset 102, a graphic processing unit (GPU) 103, an input/output device (I/O) 104, and a storage device 105. In some embodiments, the user system 10 may be a computing system such as, for example, a computer, a notebook, a server, a workstation, a portable communication terminal, a personal digital assistant (PDA), a portable multimedia player (PMP), a smartphone, and/or a wearable device.

The processor 101 may control an overall operation of the user system 10. The processor 101 may perform various operations of the user system 10 and may process data.

The nonvolatile memory modules 100 may be connected to the processor 101. For example, each of the nonvolatile memory modules 100 may have a form of a dual in-line memory module (DIMM) and may be mounted in a DIMM socket connected to the processor 101 to communicate with the processor 101. In some embodiments, each of the nonvolatile memory modules 100 may communicate with the processor 101 based on a NVDIMM protocol.

Each of the nonvolatile memory modules 100 may be used as a main memory and/or a working memory (or operating memory). Each of the nonvolatile memory modules 100 may include a nonvolatile memory and a volatile memory. The nonvolatile memory may include a memory which does not lose data stored therein when power is removed from the nonvolatile memory, such as, for example, read only memory (ROM), programmable ROM (PROM), electrically programmable ROM (EPROM), electrically erasable and programmable ROM (EEPROM), flash memory, phase-change RAM (PRAM), magnetic RAM (MRAM), resistive RAM (RRAM), and/or ferroelectric RAM (FRAM). The volatile memory may include a memory which loses data stored therein when power is removed from the volatile memory, such as, for example, static RAM (SRAM), dynamic RAM (DRAM), and/or synchronous DRAM (SDRAM).

In some embodiments, the nonvolatile memory of each nonvolatile memory module 100 may be used as a main memory of the user system 10 and/or the processor 101, and the volatile memory of the nonvolatile memory module 100 may be used as a cache memory of the user system 10, the processor 101, and/or a corresponding nonvolatile memory module 100.

The chipset 102 may be electrically connected to the processor 101 and may control hardware of the user system 10 under control of the processor 101. For example, the chipset 102 may be connected to the GPU 103, the input/output device 104, and/or the storage device 105 through main buses respectively and may perform a bridge operation with respect to the main buses.

The GPU 103 may perform a series of arithmetic operations for outputting image data of the user system 10. In some embodiments, the GPU 103 may be embedded in the processor 101 in the form of a system-on-chip (SoC).

The input/output device 104 may include various devices that make it possible to input data and/or an instruction to the user system 10 and/or to output data to an external device. For example, the input/output device 104 may include user input devices such as a keyboard, a keypad, a button, a touch panel, a touch screen, a touch pad, a touch ball, a camera, a microphone, a gyroscope sensor, a vibration sensor, a piezoelectric element, a temperature sensor, and a biometric sensor and user output devices such as a liquid crystal display (LCD), an organic light emitting diode (OLED)

display device, an active matrix OLED (AMOLED) display device, a light emitting diode (LED), a speaker, and a motor.

The storage device 105 may be used as a mass storage medium of the user system 10. The storage device 105 may include mass storage media such as, for example, a hard disk drive (HDD), a solid state drive (SSD), a memory card, a memory stick, and/or embedded storage.

Figure 2:
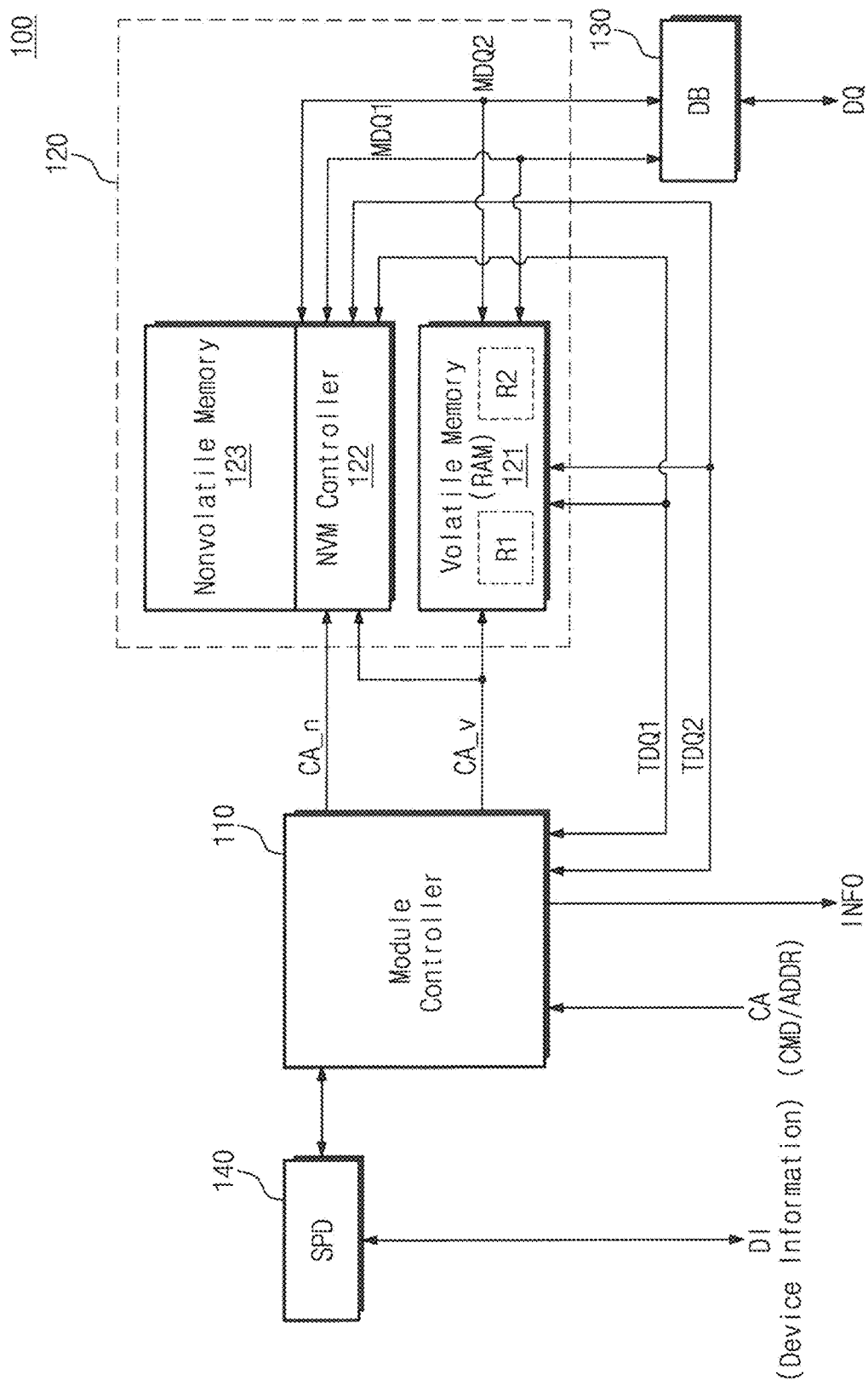
FIG. 2 is a block diagram illustrating a nonvolatile memory module of FIG. 1.

FIG. 2 is a block diagram illustrating the nonvolatile memory module of FIG. 1. Referring to FIGS. 1 and 2, the nonvolatile memory module 100 may include a module controller 110, a heterogeneous memory device 120, a data buffer (DB) 130, and a serial presence detect chip (SPD) 140.

The module controller 110 may receive a command/address CA from the processor 101 and may control the heterogeneous memory device 120 in response to the received command/address CA. For example, the module controller 110 may provide the heterogeneous memory device 120 with a command/address CA_n and a command/address CA_v in response to the command/address CA from the processor 101.

In some embodiments, the command/address CA_n may be a command/address for controlling a nonvolatile memory 123 included in the heterogeneous memory device 120, and the command/address CA_v may be a command/address for controlling a volatile memory 121 included in the heterogeneous memory device 120.

Below, for descriptive convenience, the command/address CA from the processor 101 may be referred to as "module command/address," the command/address CA_v provided from the module controller 110 to the volatile memory 121 may be referred to as "volatile memory (VM) command/address," and the command/address CA_n provided from the module controller 110 to a nonvolatile memory (NVM) controller 122 may be referred to as "nonvolatile memory (NVM) command/address." In some embodiments, module command/address, the VM command/address, and/or the NVM command/address may include separate command portions and address portions such that a module command, a VM command, and/or an NVM command may be operated on separately from a module address, a VM address, and/or an NVM address.

In some embodiments, the NVM command/address CA_n and the VM command/address CA_v may be provided through different command/address buses.

In some embodiments, the module controller 110 may be a register clock driver (RCD).

The heterogeneous memory device 120 may include the volatile memory 121, the NVM controller 122, and the nonvolatile memory 123. The volatile memory 121 may operate in response to the VM command/address CA_v from the module controller 110. The volatile memory 121 may include a first region R1 and a second region R2.

The volatile memory 121, in response to the VM command/address CA_v, may load data stored in the first region R1 on first memory data lines MDQ1 and/or first tag data lines TDQ1 and/or may store the data loaded on the first memory data lines MDQ1 and/or the first tag data lines TDQ1 in the first region R1. The volatile memory 121, in response to the VM command/address CA_v, may load data stored in the second region R2 on second memory data lines MDQ2 and/or second tag data lines TDQ2 and/or may store the data loaded on the second memory data lines MDQ2 and/or the second tag data lines TDQ2 in the second region R2. For example, the first memory data lines MDQ1, the first tag data lines TDQ1, the second memory data lines MDQ2, and/or the second tag data lines TDQ2 may be a data line group that includes a plurality of data lines.

The NVM controller 122 may operate in response to the NVM command/address CA_n from the module controller 110. For example, in response to the NVM command/address CA_n from the module controller 110, the NVM controller 122 may program data loaded on the first memory data lines MDQ1 and/or the second memory data lines MDQ2 in the nonvolatile memory 123 and/or may load data read from the nonvolatile memory 123 on the first memory data lines MDQ1 and/or the second memory data lines MDQ2.

The NVM controller 122 may perform various operations for controlling the nonvolatile memory 123. For example, the NVM controller 122 may perform operations such as garbage collection, wear leveling, and/or address conversion, to use the nonvolatile memory 123 effectively. In some embodiments, the NVM controller 122 may further include elements such as an error correction circuit and/or a randomizer. Also, the NVM controller 122 may receive the VM command/address CA_v to monitor operations performed on the volatile memory 121.

The data buffer 130 may store (e.g., buffer) data received through the first memory data lines MDQ1 and/or the second memory data lines MDQ2. The data buffer 130 may load data previously received through the first memory data lines MDQ1 on the first memory data lines MDQ1. The data buffer 130 may load data previously received through the second memory data lines MDQ2 on the second memory data lines MDQ2. The data buffer 130 may output one of the data received through the first memory data lines MDQ1 and/or the data received through the second memory data lines MDQ2 through data lines DQ. The data buffer 130 may load data received through the data lines DQ on the first memory data lines MDQ1 and/or the second memory data lines MDQ2. The data lines DQ may be connected with the processor 101.

In some embodiments, the data buffer 130 may operate in response to control of the module controller 110 (e.g., a buffer command (not shown)). In some embodiments, the data buffer 130 may distinguish between signals (or pieces of data) on the first and second memory data lines MDQ1 and MDQ2 and signals (or data) on the data lines DQ. Also, the data buffer 130 may block (or buffer) signals (or data) between the first and second memory data lines MDQ1 and MDQ2 and the data lines DQ. That is, the data buffer 130 may make it possible to prevent signals (or pieces of data) of the first and second memory data lines MDQ1 and MDQ2 from affecting a signal (or data) on the data lines DQ or a signal (or data) on the data lines DQ from affecting signals (or pieces of data) of the first and second memory data lines MDQ1 and MDQ2.

In some embodiments, the first and second memory data lines MDQ1 and MDQ2 may be data transmission paths among elements of the nonvolatile memory module (e.g., a volatile memory, a nonvolatile memory, and/or a data buffer), and the data lines DQ may be a data transmission path between the nonvolatile memory module 100 and the processor 101. The first and second tag data lines TDQ1 and TDQ2 may be a transmission path for exchanging a tag among elements (e.g., a volatile memory, a nonvolatile memory, and/or a data buffer) of the nonvolatile memory module 100.

In some embodiments, the first memory data lines MDQ1 may include a first memory data strobe line MDQS1 used for synchronization with data transmission. The second memory data lines MDQ2 may include a second memory data strobe line MDQS2 used for synchronization with data transmission. The first tag data lines TDQ1 may include a first tag data strobe line TDQS1 used to synchronization with tag transmission. The second tag data lines TDQ2 may include a second tag data strobe line TDQS2 used for synchronization with tag transmission. The data lines DQ may include a data strobe line DQS used for synchronization with data transmission.

The SPD 140 may be a programmable read only memory device (e.g., an electrically erasable programmable read-only memory (EEPROM)). The SPD 140 may include initial information and/or device information DI of the nonvolatile memory module 100. In some embodiments, the SPD 140 may include the device information DI such as a module form, a module configuration, a storage capacity, a module type, and/or an execution environment that are associated with the nonvolatile memory module 100. When the user system 10 including the nonvolatile memory module 100 is booted, the processor 101 may read the device information DI from the SPD 140 and may recognize the nonvolatile memory module 100 based on the read device information DI. The processor 101 may control the nonvolatile memory module 100 based on the device information DI read from the SPD 140.

Below, for descriptive convenience, it is assumed that the volatile memory 121 is a DRAM and that the nonvolatile memory 123 is a NAND flash memory. However, embodiments of the inventive concepts are not limited thereto. For example, the volatile memory 121 may include another kind of random access memory, and the nonvolatile memory 123 may another kind of nonvolatile memory device.

In some embodiments, the volatile memory 121 may include a plurality of volatile memory chips, each of which is implemented with a separate chip, a separate package, etc. The volatile memory chips may be connected with the module controller 110 or the NVM controller 122 through different memory data lines and/or different tag data lines.

In some embodiments, the processor 101 may use the nonvolatile memory 123 of the nonvolatile memory module 100 as a main memory. That is, the processor 101 may recognize a storage space of the nonvolatile memory 123 as a main memory region. The volatile memory 121 may operate as a cache memory of the processor 101 and/or the nonvolatile memory 123. In some embodiments, the volatile memory 121 may be used as a cache such as, for example, a write-back or a write-through cache. That is, the module controller 110 may determine a cache hit or a cache miss in response to the module command/address CA from the processor 101 and may control the volatile memory 121 or the nonvolatile memory 123 based on the determination result. The determination result indicating the cache hit or the cache miss may be sent to the processor 101 as cache information INFO. In some embodiments, the cache information INFO may be shared by the module controller 110 and the NVM controller 122.

In some embodiments, the cache hit may indicate that data corresponding to the module command/address CA received from the processor 101 is stored in the volatile memory 121. The cache miss may indicate that no data corresponding to the module command/address CA received from the processor 101 is stored in the volatile memory 121.

In some embodiments, the module controller 110 may determine the cache hit or the cache miss based on a tag. The module controller 110 may determine the cache hit or the cache miss based on a result of comparing the module command/address CA from the processor 101 and the tag.

In some embodiments, the tag may include a portion of an address that corresponds to data stored in the volatile memory 121. The tag may include an extended address, which is associated with the nonvolatile memory 123, of the module address of data stored in the volatile memory 121. In some embodiments, the module controller 110 may exchange the tag with the volatile memory 121 through the first and second tag data lines TDQ1 and TDQ2. In some embodiments, when data is written in the volatile memory 121, the tag corresponding to the data may be written therein together with the data under control of the module controller 110.

In some embodiments, since the first region R1 operates as a first way and the second region R2 operates as a second way, the volatile memory 121 may be used as a 2-way set associative cache. Some embodiments of the present inventive concepts are described herein as having a number of ways of the volatile memory 121, such as "2." However, embodiments of the inventive concepts are not limited thereto. For example, the volatile memory 121 may operate a set associative cache having two or more ways or three or more ways.

In some embodiments, the volatile memory 121 may operate as an m-way set associative cache of n:m (n being a natural number and m being a natural number less than n) with respect to the nonvolatile memory 123. For example, "n" may be the number of nonvolatile storage regions in the nonvolatile memory 123, and "m" may be the number of internal regions of the volatile memory 121. As illustrated in FIG. 2, "m" may be "2" or more when the volatile memory 121 includes the first region R1 and the second region R2.

Each of the first and second regions R1 and R2 of the volatile memory 121 may correspond to first to n-th nonvolatile storage regions of the nonvolatile memory 123. In this case, a capacity (or size) of each of the first and second regions R1 and R2 may be the same as that of each of the nonvolatile storage regions. In some embodiments, each of the first and second regions R1 and R2 may further include a region for storing additional information (e.g., a tag, an ECC, and/or dirty information).

Although not shown in FIG. 2, the nonvolatile memory module 100 may further include a separate memory (not shown). The separate memory may store information, which is used in the NVM controller 122, such as data, programs, and/or software. For example, the separate memory may store information, which is managed by the NVM controller 122, such as a mapping table and a flash translation layer (FTL). In some embodiments, the separate memory may be a buffer memory that temporarily stores data read from the nonvolatile memory 123 and/or data to be stored in the nonvolatile memory 123.

Below, for descriptive convenience, "_v" may be attached to elements (e.g., data, a tag, a command/address, etc.) associated with the volatile memory 121. For example, a VM command/address that is output from the module controller 110 to control the volatile memory 121 may be expressed by "CA_v", and data that is output from the volatile memory 121 under control of the module controller 110 may be expressed by "DT_v."

Likewise, "_n" may be attached to elements (e.g., data, a tag, a command/address, etc.) associated with the nonvolatile memory 123. For example, an NVM command/address that is output from the module controller 110 to control the nonvolatile memory 123 may be expressed by "CA_n", and data that is output from the nonvolatile memory 123 under control of the module controller 110 may be expressed by "DT_n."

Figure 3:
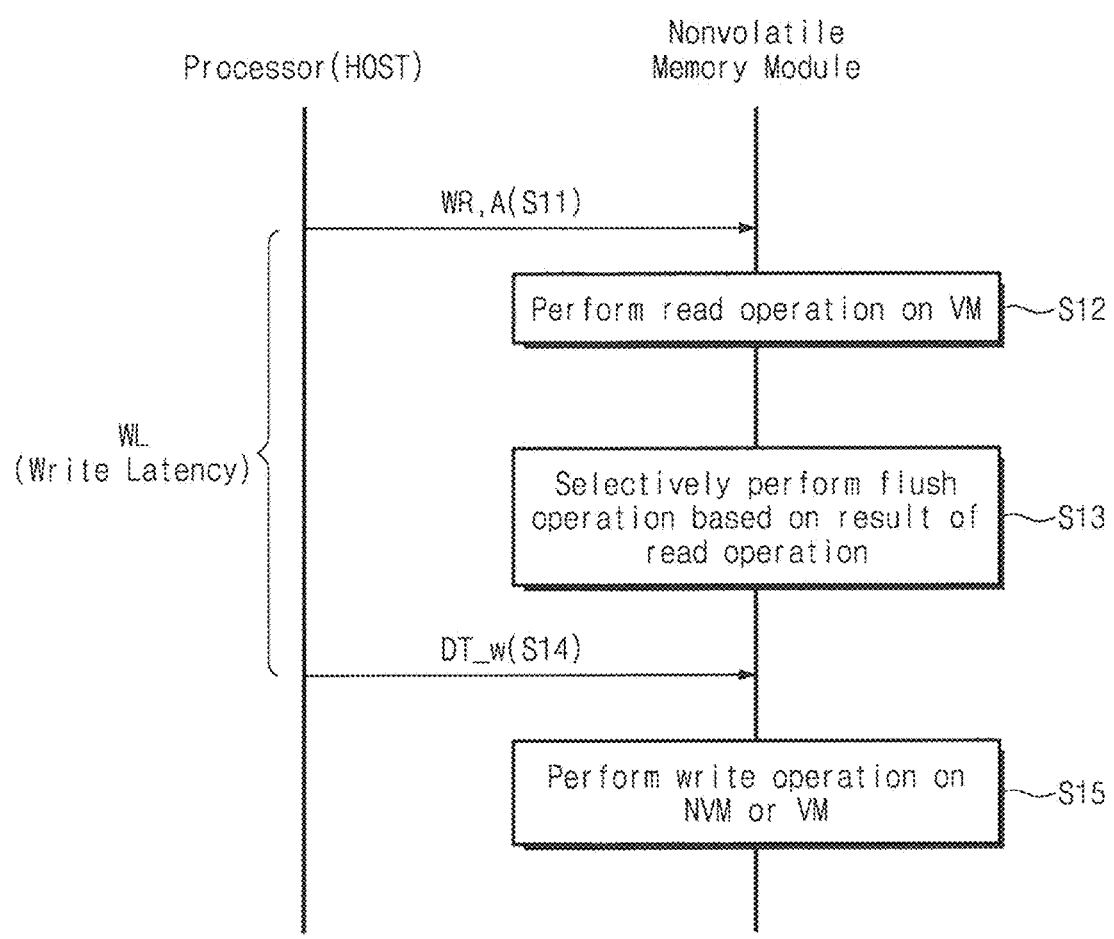
FIG. 3 is a flowchart illustrating a write operation of a nonvolatile memory module of FIG. 2.

FIG. 3 is a flowchart illustrating a write operation of the nonvolatile memory module of FIG. 2. Referring to FIGS. 1 to 3, in operation S11, the processor 101 may send a module write command WR and an address "A" to the nonvolatile memory module 100. An address "A" corresponding to write data DT_w (which may be provided by processor 101 at a later step) may be a logical address corresponding to a portion, in which the write data DT_w is to be written, of a storage space of the nonvolatile memory 123.

In operation S12, the nonvolatile memory module 100 may perform a read operation with respect to the volatile memory 121 in response to the received module write command WR and the received address "A." For example, the nonvolatile memory module 100 may read pieces of data and/or tags from a portion, which corresponds to the received address "A" or to a portion of the received address "A," of an area of the volatile memory 121. In some embodiments, the nonvolatile memory module 100 may determine whether a cache hit or a cache miss occurs, by comparing the read tags with the address "A" or a portion of the address "A."

In operation S13, the nonvolatile memory module 100 may selectively perform a flush operation based on the result of the read operation performed in operation S12. For example, when the result of the read operation indicates the cache miss, the nonvolatile memory module 100 may perform a flush operation such that at least one of a plurality of pieces of data read from the volatile memory 121 is stored in the nonvolatile memory 123. For example, when the result of the read operation indicates the cache miss and when the pieces of data read from the volatile memory 121 are updated after having been written in the volatile memory 121 (i.e., in the case of a dirty state), the nonvolatile memory module 100 may perform a flush operation such that at least one of the plurality of pieces of data read from the volatile memory 121 is stored in the nonvolatile memory 123.

In some embodiments, as described with reference to FIG. 2, the NVM controller 122, which controls the nonvolatile memory 123, and the volatile memory 121 may share the first and second memory data lines MDQ1 and MDQ2. That is, when the first and second memory data lines MDQ1 and MDQ2 are driven by data read from the volatile memory 121, the NVM controller 122 that controls the nonvolatile memory 123 may receive (or detect) data read from the volatile memory 121 through the first and second memory data lines MDQ1 and MDQ2. The NVM controller 122 may program at least one of the pieces of received data in the nonvolatile memory 123.

In some embodiments, when the result of the read operation in operation S12 indicates the cache hit, or when the result of the read operation in operation S12 indicates the cache miss and is not a dirty state, the nonvolatile memory module 100 may not perform the flush operation.

In some embodiments, operations of the nonvolatile memory module 100 such as the flush operation, determination of the cache hit or cache miss, and/or determination of a dirty state may be performed by the NVM controller 122 or the module controller 110.

In operation S14, the processor 101 may send the write data DT_w to the nonvolatile memory module 100. In some embodiments, operation S14 may be performed after a time elapses from operation S11. That is, the processor 101 may send the write data DT_w to the nonvolatile memory module 100 when a time elapses after sending the module write command WR and the address "A" to the nonvolatile memory module 100. In this case, the time may be a write latency WL. In some embodiments, the write latency WL may be a time or a clock period that is determined according to the operating characteristic of the nonvolatile memory module 100. Information about the write latency WL may be stored in the SPD 140 and may be provided as the device information DI to the processor 101. The processor 101 may output the write data DT_w based on the device information DI.

In operation S15, the nonvolatile memory module 100 may write or program the received write data DT_w in the volatile memory 121 or the nonvolatile memory 123.

Figure 4:
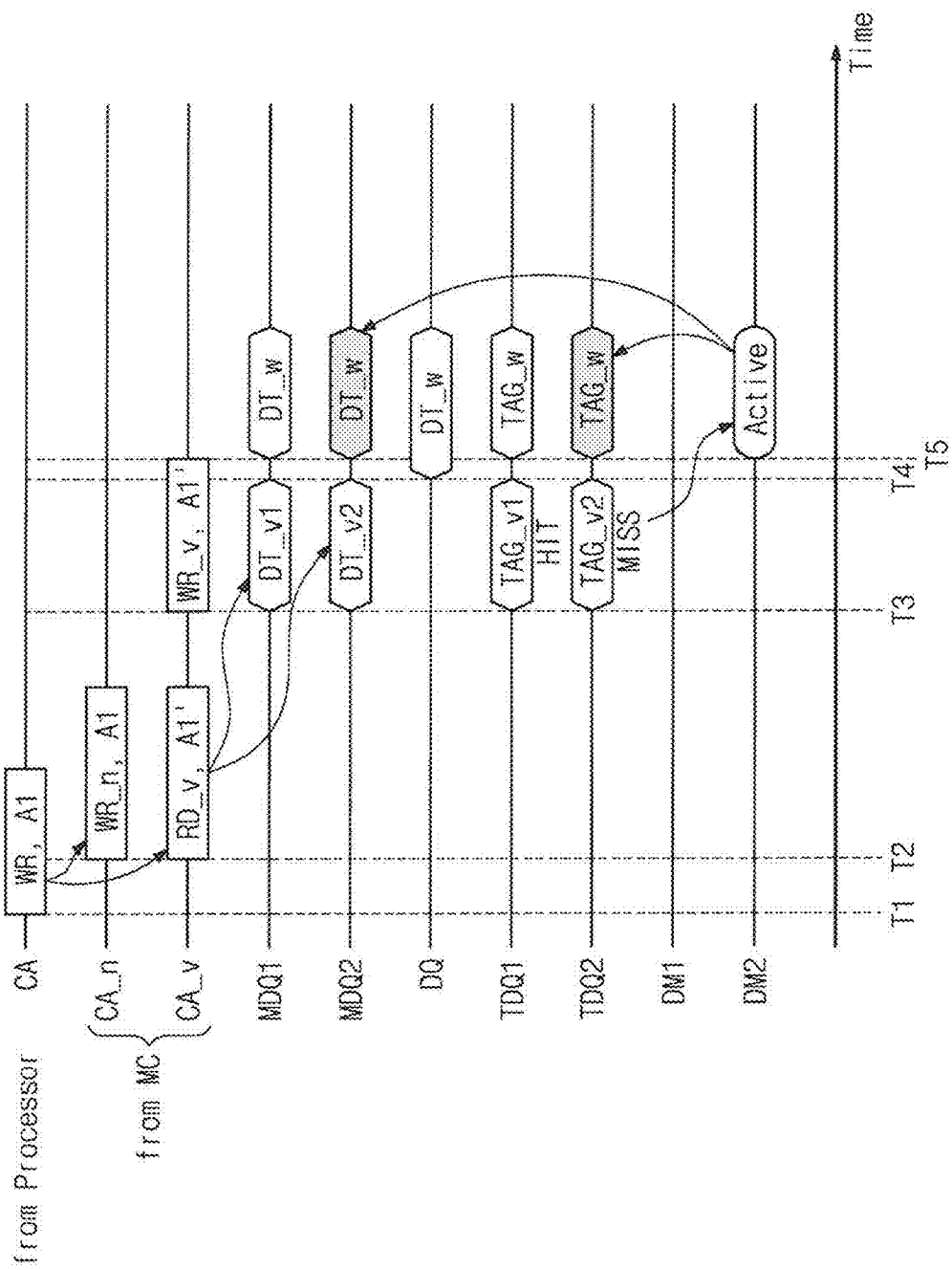
FIG. 4 is a timing diagram describing an operating method of FIG. 3 in detail.

FIG. 4 is a timing diagram describing the operating method of FIG. 3 in detail. In FIG. 4, the x-axis indicates time. FIG. 4 illustrates an example timing and, in some embodiments, sizes and timings associated with commands, addresses, data, tags, etc. are not be limited to the timing diagram illustrated in FIG. 4.

Referring to FIGS. 1 to 4, at T1, the processor 101 may send a module command/address CA to the nonvolatile memory module 100. For example, the module command/address CA may include the module write command WR and a first address A1.

At T2, the module controller 110 may generate an NVM command/address CA_n and a first VM command/address CA_v from the module command/address CA. The NVM command/address CA_n may include an NVM write command WR_n and the first address A1. The first VM command/address CA_v may include a VM read command RD_v and a first partial address A1'. The first partial address A1' may be a portion of the first address A1.

For example, a capacity of the nonvolatile memory 123 may be greater than that of the volatile memory 121. Accordingly, a length of an address for accessing the volatile memory 121 may be less than that of an address for accessing the nonvolatile memory 123. The module command/address CA may be used to send the first address A1 for accessing the nonvolatile memory 123 to the nonvolatile memory module 100. The first address A1 may be included in the NVM command/address CA_n, and the first partial address A1', which is for accessing the volatile memory 121, of the first address A1 may be included in the first VM command/address CA_v. In some embodiments, a portion corresponding to a difference between the first address A1 and the first partial address A1' may be used to address extended capacities provided to the nonvolatile memory 123 compared to the volatile memory 121.

At T3, in response to the VM read command RD_v and the first partial address A1', the volatile memory 121 may load first cache data DT_v1, which is read from the first region R1 by using the first partial address A1', on the first memory data lines MDQ1 and may load a first cache tag TAG_v1, which is read from the first region R1 by using the first partial address A1', on the first tag data lines TDQ1.

Also, in response to the VM read command RD_v and the first partial address A1', the volatile memory 121 may load second cache data DT_v2, which is read from the second region R2 by using the first partial address A1', on the second memory data lines MDQ2 and may load a second cache tag TAG_v2, which is read from the second region R2 by using the first partial address A1', on the second tag data lines TDQ2.

The module controller 110 or the NVM controller 122 may determine the cache hit or the cache miss based on the first and second cache tags TAG_v1 and TAG_v2 loaded on the first and second tag data lines TDQ1 and TDQ2. For example, the first cache tag TAG_v1 may be determined as a cache hit when a sum of the first cache tag TAG_v1 and the first partial address A1' is the same as the first address A1, and the first cache tag TAG_v1 may be determined as a cache miss when the sum of the first cache tag TAG_v1 and the first partial address A1' is different from the first address A1. Likewise, the second cache tag TAG_v2 may be determined as a cache hit when a sum of the second cache tag TAG_v2 and the first partial address A1' is the same as the first address A1, and the second cache tag TAG_v2 may be determined as the cache miss when the sum of the second cache tag TAG_v2 and the first partial address A1' is different from the first address A1. In the example embodiment illustrated in FIG. 4, it is assumed that the first cache tag TAG_v1 is determined as the cache hit and the second cache tag TAG_v2 is determined as the cache miss.

The module controller 110 may output a second VM command/address CA_v, which includes the VM write command WR_v and the first partial address A1', in accordance with the timing at which the write data DT_w is to be received. An embodiment of the present inventive concepts is exemplified in FIG. 4 in which the VM write command WR_v and the first partial address A1' are output at T3. However, embodiments of the inventive concepts are not limited thereto. A timing with which the VM write command WR_v and the first partial address A1' are output may be stored in the SPD 140 and may be shared by the processor 101.

At T4, the processor 101 may load the write data DT_w on the data lines DQ. For example, the processor 101 may load the write data DT_w on the data lines DQ in accordance with the timing when the VM write command WR_v and the first partial address A1' are output. In some embodiments, the processor 101 may set a difference between output timing of the module write command WR and the first address A1 and output timing of the write data DT_w, that is, the write latency WL based on information obtained from the SPD 140. In some embodiments, for example, the write command WR may be output by the processor 101 at time T1 and the write data DT_w may be output by the processor 101 at time T4, and the write latency WL may be the time between T1 and T4.

At T5, the data buffer 130 may load data received through the data lines DQ on the first memory data lines MDQ1 and the second memory data lines MDQ2 under control of the module controller 110. That is, the write data DT_w may be loaded on the first memory data lines MDQ1 and the second memory data lines MDQ2.

When the data buffer 130 loads the write data DT_w, the module controller 110 or the NVM controller 122 may load a write tag TAG_w, which corresponds to the first address A1, on the first tag data lines TDQ1 and the second tag data lines TDQ2. That is, the same write tag TAG_w may be loaded on the first memory data lines TDQ1 and the second memory data lines TDQ2. For example, the write tag TAG_w may correspond to a difference between the first partial address A1' and the first address A1.

When the data buffer 130 loads the write data DT_w, the module controller 110 may inactivate a first data mask signal DM1 and may activate a second data mask signal DM2. The first data mask signal DM1 may correspond to the first memory data lines MDQ1 and the first tag data lines TDQ1 and may be included in the VM command/address CA_v. The second data mask signal DM2 may correspond to the second memory data lines MDQ2 and the second tag data lines TDQ2 and may be included in the VM command/address CA_v.

In the case where the first data mask signal DM1 is inactivated or remains at an inactive state, the volatile memory 121 may write the write data DT_w and the write tag TAG_w, which are respectively loaded on the first memory data lines MDQ1 and the first tag data lines TDQ1, in the first region R1 in response to the VM write command WR_v and the first partial address A1' issued at T3.

In the case where the second data mask signal DM2 is activated, even though the VM write command WR_v and the first partial address A1' are issued at T3, the volatile memory 121 may ignore the write data DT_w and the write tag TAG_w, which are respectively loaded on the second memory data lines MDQ2 and the second tag data lines TDQ2, without storing them in the second region R2. In other words, in some embodiments, respective first and second data mask signals DM1 and DM2 may control whether data on respective first and second memory data lines MDQ1 and MDQ2 and/or respective first and second tag data lines TDQ1 and TDQ2 are ignored.

The NVM controller 122 may write one of the write data DT_w loaded on the first memory data lines MDQ1 and the write data DT_w loaded on the second memory data lines MDQ2 in the nonvolatile memory 123 based on the module write command WR and the first address A1 issued at T1. For example, the NVM controller 122 may refer to the first and second data mask signals DM1 and DM2 included in the VM command/address CA_v. For example, the NVM controller 122 may write the write data DT_w, which is loaded on the first memory data lines MDQ1 and corresponds to the first cache tag TAG_v1 determined as the cache hit, in the nonvolatile memory 123. For example, the NVM controller 122 may not write the write data DT_w, which is loaded on the second memory data lines MDQ2 and corresponds to the second cache tag TAG_v2 determined as the cache miss, in the nonvolatile memory 123. As another example, the NVM controller 122 may be configured to write, in the nonvolatile memory 123, write data DT_w loaded on fixed memory data lines of the first memory data lines MDQ1 and the second memory data lines MDQ2.

As described above, when the module command/address CA includes the module write command WR and the first address A1, the volatile memory 121 may output first and second cache tags TAG_v1 and TAG_v2 and first and second cache data DT_v1 and DT_v2 corresponding to the first address A1. The module controller 110 or the NVM controller 122 may determine the cache hit or the cache miss by using the first and second cache tags TAG_v1 and TAG_v2. If the cache hit occurs from one cache tag, the volatile memory 121 may overwrite write data and a write tag on a region corresponding to the hit cache tag. In this case, the data mask signals DM1 and DM2 may make it possible to prevent regions corresponding to two cache tags from being overwritten. Accordingly, the volatile memory 121 may operate as a set associative cache memory having two or more ways with respect to the nonvolatile memory 123.

In some embodiments, in the case where two cache tags TAG_v1 and TAG_v2 correspond to the cache miss, the module controller 110 or the NVM controller 122 may select one of the two cache tags TAG_v1 and TAG_v2 and may control the data mask signals DM1 and DM2 such that a write tag and write data are stored in a region corresponding to the selected cache tag. For example, the module controller 110 or the NVM controller 122 may control the data mask signals DM1 and DM2 such that a cache tag that is not at a dirty state is selected. For example, the module controller 110 or the NVM controller 122 may control the data mask signals DM1 and DM2 such that a cache tag where the cache hit is generated longer ago or a cache tag which is stored in the volatile memory 121 longer ago is selected.

For example, in the case where cache data corresponding to a selected cache tag is at a dirty state, under control of the module controller 110 or the NVM controller 122, a write tag and write data may be stored after the cache data of the dirty state is flushed into the nonvolatile memory 123.

Figure 5:
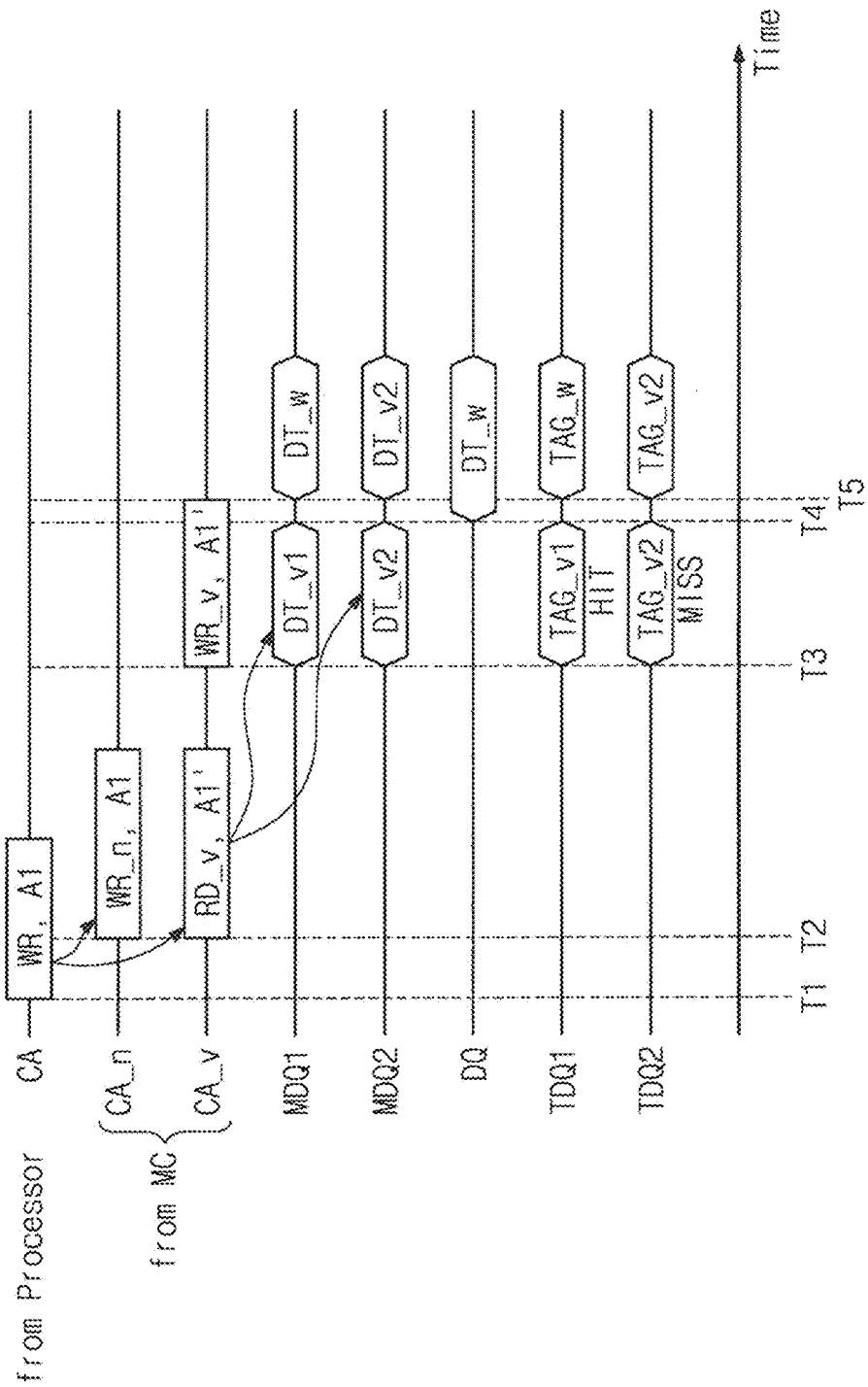
FIG. 5 is a timing diagram describing an application of an operation method of FIG. 3 in detail.

FIG. 5 is a timing diagram describing an application of the operation method of FIG. 3 in detail. In FIG. 5, the x-axis indicates time. FIG. 5 illustrates an example timing and, in some embodiments, sizes and timings associated with commands, addresses, data, tags, etc. are not be limited to the timing diagram illustrated in FIG. 5.

Referring to FIGS. 1 to 3 and 5, at T1, the processor 101 may send a module command/address CA, which includes a module write command WR and a first address A1, to the nonvolatile memory module 100.

At T2, the module controller 110 may generate an NVM command/address CA_n and a first VM command/address CA_v from the module command/address CA. The NVM command/address CA_n may include an NVM write command WR_n and the first address A1. The first VM command/address CA_v may include a VM read command RD_v and a first partial address A1'.

At T3, in response to the VM read command RD_v and the first partial address A1', the volatile memory 121 may load first cache data DT_v1, which is read from the first region R1 by using the first partial address A1', on the first memory data lines MDQ1, and may load a first cache tag TAG_v1, which is read from the first region R1 by using the first partial address A1', on the first tag data lines TDQ1.

Also, in response to the VM read command RD_v and the first partial address A1', the volatile memory 121 may load second cache data DT_v2, which is read from the second region R2 by using the first partial address A1', on the second memory data lines MDQ2, and may load a second cache tag TAG_v2, which is read from the second region R2 by using the first partial address A1', on the second tag data lines TDQ2.

The module controller 110 or the NVM controller 122 may determine a cache hit or a cache miss based on the first and second cache tags TAG_v1 and TAG_v2 loaded on the first and second tag data lines TDQ1 and TDQ2. In the example embodiment illustrated in FIG. 5, it is assumed that the first cache tag TAG_v1 is determined as the cache hit and the second cache tag TAG_v2 is determined as the cache miss.

The module controller 110 may output a second VM command/address CA_v, which includes the VM write command WR_v and the first partial address A1', in accordance with the timing at which the write data DT_w is to be received. As illustrated in the example embodiment of FIG. 5, the VM write command WR_v and the first partial address A1' may be output at T3. However, embodiments of the inventive concepts are not limited thereto.

At T4, the processor 101 may load the write data DT_w on the data lines DQ.

At T5, the data buffer 130 may load write data DT_w received through the data lines DQ on the first memory data lines MDQ1 corresponding to the first cache tag TAG_v where the cache hit is generated, under control of the module controller 110. When the data buffer 130 loads the write data DT_w, the module controller 110 or the NVM controller 122 may load a write tag TAG_w, which corresponds to the first address A1, on the first memory data lines MDQ1 corresponding to the first cache tag TAG_v1 where the cache hit is generated.

Also, the data buffer 130 may again load second cache data DT_v2, which is received through the second memory data lines MDQ2 corresponding to the second cache tag TAG_v2 where the cache miss is generated, on the second memory data lines MDQ2 under control of the module controller 110. When the data buffer 130 loads the second cache data DT_v2, the module controller 110 or the NVM controller 122 may again load second cache data DT_v2, which is received through the second cache data lines TDQ2 corresponding to the second cache tag TAG_v2 where the cache miss is generated, on the second tag data lines TDQ2. In other words, responsive to the second cache data DT_v2 and the second cache tag TAG_v2 generating a cache miss, the module controller 110 or the NVM controller 122 may reload the second memory data lines MDQ2 and the second tag data lines TDQ2 with the same second cache data DT_v2 and second cache tag TAG_v2 that were previously on those respective lines.

The volatile memory 121 may write the write data DT_w and the write tag TAG_w, which are respectively loaded on the first memory data lines MDQ1 and the first tag data lines TDQ1, in the first region R1 in response to the VM write command WR_v and the first partial address A1' issued at T3. Also, the volatile memory 121 may write the second tag data DT_v2 and the second cache tag TAG_v2, which are respectively loaded on the second memory data lines MDQ2 and the second tag data lines TDQ2, in the second region R2 in response to the VM write command WR_v and the first partial address A1' issued at T3.

The NVM controller 122 may write the write data DT_w, which is loaded on the first memory data lines MDQ1 corresponding to the first cache tag TAG_v1 where the cache hit is generated, in the nonvolatile memory 123 based on the module write command WR and the first address A1 issued at T1.

Compared to FIG. 4, the nonvolatile memory module 100 illustrated in FIG. 5 may not use the data mask signals DM1 and DM2. The data buffer 130 may load write data on memory data lines where the cache hit is generated and may again load cache data, which is previously received, on memory data lines where the cache miss is generated. The module controller 110 or the NVM controller 122 may load a write tag on tag data lines where the cache hit is generated and may again load a cache tag, which is previously received, on tag data lines where the cache miss is generated. That is, since the volatile memory 121 stores write data and a write tag together with previous cache data and a previous cache tag into first and second regions R1 and R2 respectively, data and a tag in one of two or more regions may be updated while maintaining data and a tag in the remaining regions. Accordingly, the volatile memory 121 may operate as a set associative cache memory having two or more ways with respect to the nonvolatile memory 123.

In some embodiments, in the case where two cache tags TAG_v1 and TAG_v2 correspond to the cache miss, the module controller 110 or the NVM controller 122 may select one of the two cache tags TAG_v1 and TAG_v2 and may control the data buffer 130 such that a write tag and write data are stored in a region corresponding to the selected cache tag. For example, the module controller 110 or the NVM controller 122 may select a cache tag that is not at a dirty state. For example, the module controller 110 or the NVM controller 122 may select a cache tag where the cache hit is generated longer ago or a cache tag which is stored in the volatile memory 121 longer ago.

For example, in the case where cache data corresponding to a selected cache tag is at a dirty state, under control of the module controller 110 or the NVM controller 122, a write tag and write data may be stored after the cache data of the dirty state is flushed into the nonvolatile memory 123.

Figure 6:
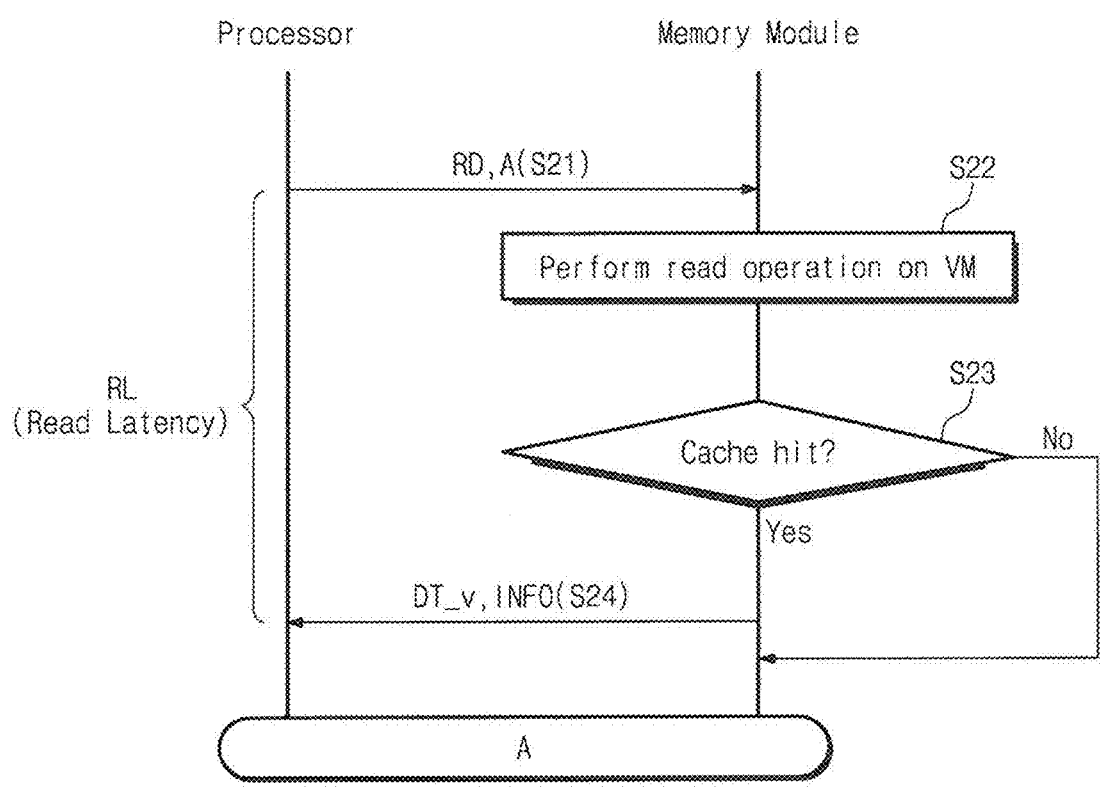
FIG. 6 is a flowchart illustrating a read operation of a nonvolatile memory module of FIG. 2.

FIG. 6 is a flowchart illustrating a read operation of the nonvolatile memory module 100 of FIG. 2. Referring to FIGS. 1, 2, and 6, in operation S21, the processor 101 may send a module read command RD and an address "A" to the nonvolatile memory module 100.

In operation S21, the nonvolatile memory module 100 may perform a read operation with respect to the volatile memory 121 in response to the module read command RD and the address "A." The nonvolatile memory module 100 may read data and a tag stored in a region, which corresponds to the address "A," from among regions of the volatile memory 121.

In operation S22, the nonvolatile memory module 100 may determine whether a cache hit or a cache miss is generated, based on the read result. As described above, the tag may include information about a portion of an address. The nonvolatile memory module 100 may determine whether a cache hit or a cache miss is generated by comparing the tag with the received address "A." When a portion of the received address "A" is the same as the tag, the nonvolatile memory module 100 may determine that the cache hit is generated. When a portion of the received address "A" is different from the tag, the nonvolatile memory module 100 may determine that the cache miss is generated.

In some embodiments, a read operation that is performed when the cache miss is generated will be described with reference to FIGS. 7 and 8.

When the cache hit is generated, in operation S23, the nonvolatile memory module 100 may send cache data DT_v read from the volatile memory 121 and cache information INFO to the processor 101. The cache information INFO may include information about whether the output data corresponds to a cache hit or a cache miss. The processor 101 may determine whether data DT_v received through the cache information INFO is valid data. That is, the nonvolatile memory module 100 may provide the processor 101 with information about the cache hit as the cache information INFO so that the processor 101 may recognize the read data as valid data.

In some embodiments, operation S24 may be performed after a time elapses from operation S21. That is, the processor 101 may receive data read from the nonvolatile memory module 100 when a time elapses after sending the module read command RD and the address "A" to the nonvolatile memory module 100. In this case, the time may be a read latency RL. The read latency RL may be a time or a clock period that is determined according to the operating characteristic of the nonvolatile memory module 100. Information about the read latency RL may be stored in the SPD 140 and may be provided as the device information DI to the processor 101. The processor 101 may control the nonvolatile memory module 100 based on the read latency RL.

Figure 7:
FIG. 7 is a timing diagram describing a read operation of FIG. 5 in detail.

FIG. 7 is a timing diagram describing the read operation of FIG. 6 in detail. In FIG. 7, the x-axis indicates time. FIG. 7 illustrates an example timing and, in some embodiments, sizes and timings associated with commands, addresses, data, tags, etc. are not be limited to the timing diagram illustrated in FIG. 7.

Referring to FIGS. 1, 2, 6, and 7, at T1, the processor 101 may send a module command/address CA to the nonvolatile memory module 100. For example, the module command/address CA may include the module read command RD and a first address A1.

At T2, the module controller 110 may generate an NVM command/address CA_n and a VM command/address CA_v from the module command/address CA. The NVM command/address CA_n may include an NVM read command RD_n and the first address A1. The VM command/address CA_v may include a VM read command RD_v and a first partial address A1'. The first partial address A1' may be a portion of the first address A1.

At T3, in response to the VM read command RD_v and the first partial address A1', the volatile memory 121 may load first cache data DT_v1, which is read from the first region R1 by using the first partial address A1', on the first memory data lines MDQ1 and may load a first cache tag TAG_v1, which is read from the first region R1 by using the first partial address A1', on the first tag data lines TDQ1.

Also, in response to the VM read command RD_v and the first partial address A1', the volatile memory 121 may load second cache data DT_v2, which is read from the second region R2 by using the first partial address A1', on the second memory data lines MDQ2 and may load a second cache tag TAG_v2, which is read from the second region R2 by using the first partial address A1', on the second tag data lines TDQ2.

The module controller 110 or the NVM controller 122 may determine a cache hit or a cache miss based on the first and second cache tags TAG_v1 and TAG_v2 loaded on the first and second tag data lines TDQ1 and TDQ2. For example, the first cache tag TAG_v1 may be determined as a cache hit when a sum of the first cache tag TAG_v1 and the first partial address A1' is the same as the first address A1 and may be determined as a cache miss when the sum of the first cache tag TAG_v1 and the first partial address A1' is different from the first address A1. Likewise, the second cache tag TAG_v2 may be determined as a cache hit when a sum of the second cache tag TAG_v2 and the first partial address A1' is the same as the first address A1 and may be determined as a cache miss when the sum of the second cache tag TAG_v2 and the first partial address A1' is different from the first address A1. In the embodiment illustrated in FIG. 7, it is assumed that the first cache tag TAG_v1 is determined as a cache hit and the second cache tag TAG_v2 is determined as a cache miss.

At T4, the data buffer 130 may output first cache data DT_v1, which is loaded on the first memory data lines MDQ1 corresponding to the first cache tag TAG_v1 where the cache hit is generated, on the data lines DQ under control of the module controller 110. Also, the module controller 110 may output the cache information INFO indicating the cache hit to the processor 101.

In some embodiments, when the cache hit is generated, the NVM controller 122 may ignore the NVM read command RD_n and the first address A1 that are issued at T2.

As described above, when the module read command RD is provided from the processor 101, the volatile memory 121 outputs cached cache tags and cache data from the plurality of regions R1 and R2, respectively. The module controller 110 or the NVM controller 122 compares the cache tags with the first address A1 to determine whether a cache hit or a cache miss is generated. The module controller 110 controls the data buffer 130 such that cache data where the cache hit is generated is output through the data lines DQ. Accordingly, the volatile memory 121 may operate as a multi-way set associative cache of the nonvolatile memory 123.

Figure 8:
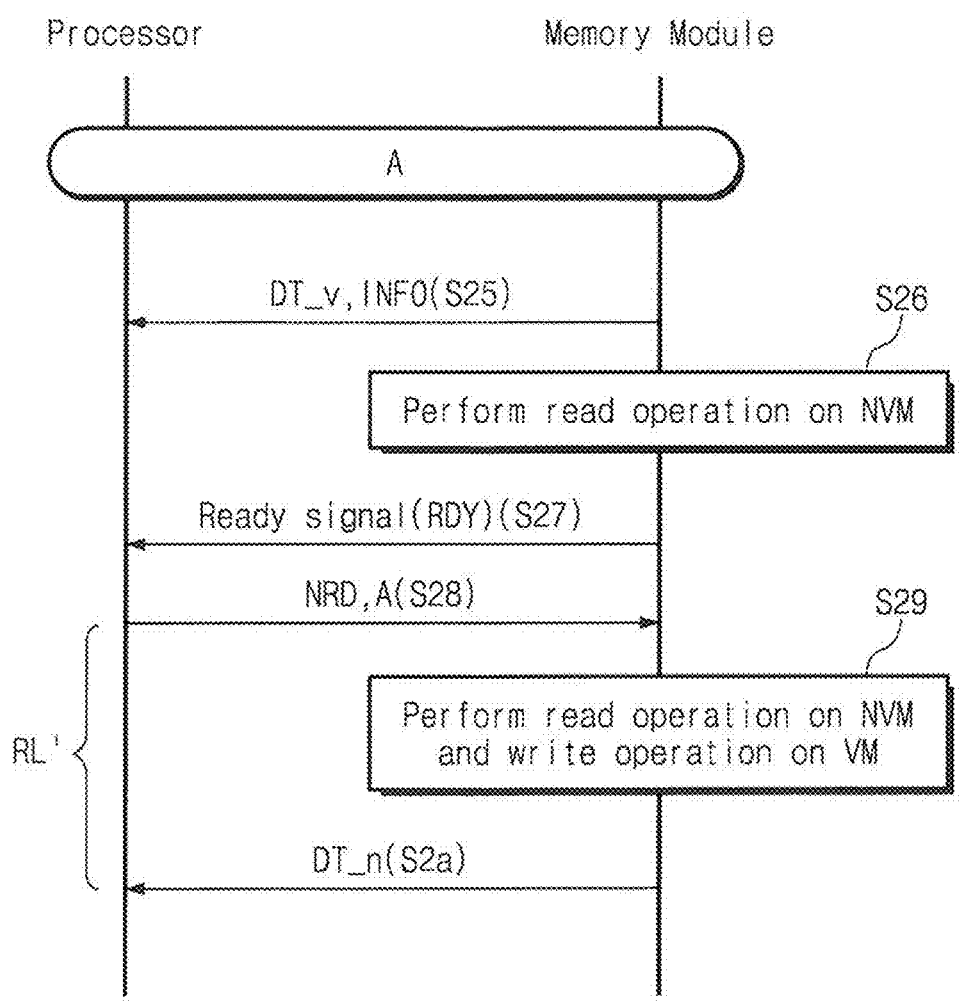
FIG. 8 is a flowchart illustrating another read operation of a nonvolatile memory module of FIG. 2.

FIG. 8 is a flowchart illustrating another read operation of the nonvolatile memory module 100 of FIG. 2. A read operation that is performed when a cache miss is generated will be described with reference to FIG. 8.

Referring to FIGS. 1, 2, 6, and 8, when a determination result of operation S23 indicates a cache miss, operation S25 is performed. In operation S25, the nonvolatile memory module 100 may send cache data DT_v and cache information INFO read from the volatile memory 121 to the processor 101. In this case, the cache information INFO may include information about the cache miss.

In some embodiments, as described above, operation S25 may be performed after a read latency RL elapses from a point in time when a module read command RD and an address "A" are received.

In operation S26, the nonvolatile memory module 100 may perform a pre-read operation with respect to the nonvolatile memory 123. In some embodiments, the pre-read operation may indicate an operation in which the NVM controller 122 reads data from the nonvolatile memory 123 and stores the read data in a data buffer (not shown) included in the NVM controller 122. In some embodiments, the pre-read operation may indicate an operation of preparing read data to allow the NVM controller 122 to output data from the nonvolatile memory 123 within the read latency RL based on a command of the processor 101. That is, when the pre-read operation associated with the nonvolatile memory 123 is completed, the nonvolatile memory module 100 may output data, which is read from the nonvolatile memory 123, within the read latency RL in response to the command from the processor 101.

In some embodiments, the pre-read operation may be performed while operations S22 to S25 are performed. Alternatively, when the cache miss is generated, the pre-read operation may be performed by the NVM controller 122. For example, the NVM controller 122 may receive a first address A1 from the module controller 110 and may receive first and second cache tags TAG_v1 and TAG_v2 through the first and second tag data lines TDQ1 and TDQ2. The NVM controller 122 may compare the first address A1 with the first and second cache tags TAG_v1 and TAG_v2 and may determine whether a cache hit or a cache miss is generated, based on the comparison result. In some embodiments, the NVM controller 122 may receive cache information INFO from the module controller 110 to determine whether the cache hit or the cache miss is generated. The NVM controller 122 may perform the pre-read operation based on the determination result.

After the pre-read operation is completed, in operation S27, the nonvolatile memory module 100 may provide a ready signal RDY to the processor 101. In some embodiments, the ready signal RDY may be a signal indicating that the nonvolatile memory module 110 completed the pre-read operation. The ready signal RDY may be provided through a signal line through which the cache information INFO is transmitted or through a separate signal line.

In operation S28, the processor 101 may provide the nonvolatile memory module 100 with a module read command NRD and an address "A" in response to the ready signal RDY. In some embodiments, the module read command NRD may be different from the module read command RD of operation S21. The module read command NRD may be a command/address for reading data from the nonvolatile memory 123.

In operation S29, the nonvolatile memory module 100 may perform an operation of outputting data read from the nonvolatile memory 123 and a write operation of the volatile memory 121 in response to the module read command NRD and the address "A." For example, the NVM controller 122 of the nonvolatile memory module 100 may load data prepared through the pre-read operation on the first memory data lines MDQ1 or the second memory data lines MDQ2. The volatile memory 121 may store data received from the NVM controller 122 through the first memory data lines MDQ1 or the second memory data lines MDQ2, that is, data output from the nonvolatile memory 123. In this case, the write operation of the volatile memory 121 may be a read caching operation.

In operation S2a, the nonvolatile memory module 100 may send NVM data DT_n from the nonvolatile memory 123 to the processor 101. For example, the nonvolatile memory module 100 may output the NVM data DT_n, which is received from the nonvolatile memory 123, through the data line DQ. In some embodiments, operation S2a may be performed after a time elapses from operation S28. The time may be a read latency RL'. In some embodiments, the read latency RL' of FIG. 8 may be different from the read latency RL of FIG. 6. Information about the read latencies RL and RL' may be stored in the SPD 140 and may be provided as the device information DI to the processor 101.

Figure 9:
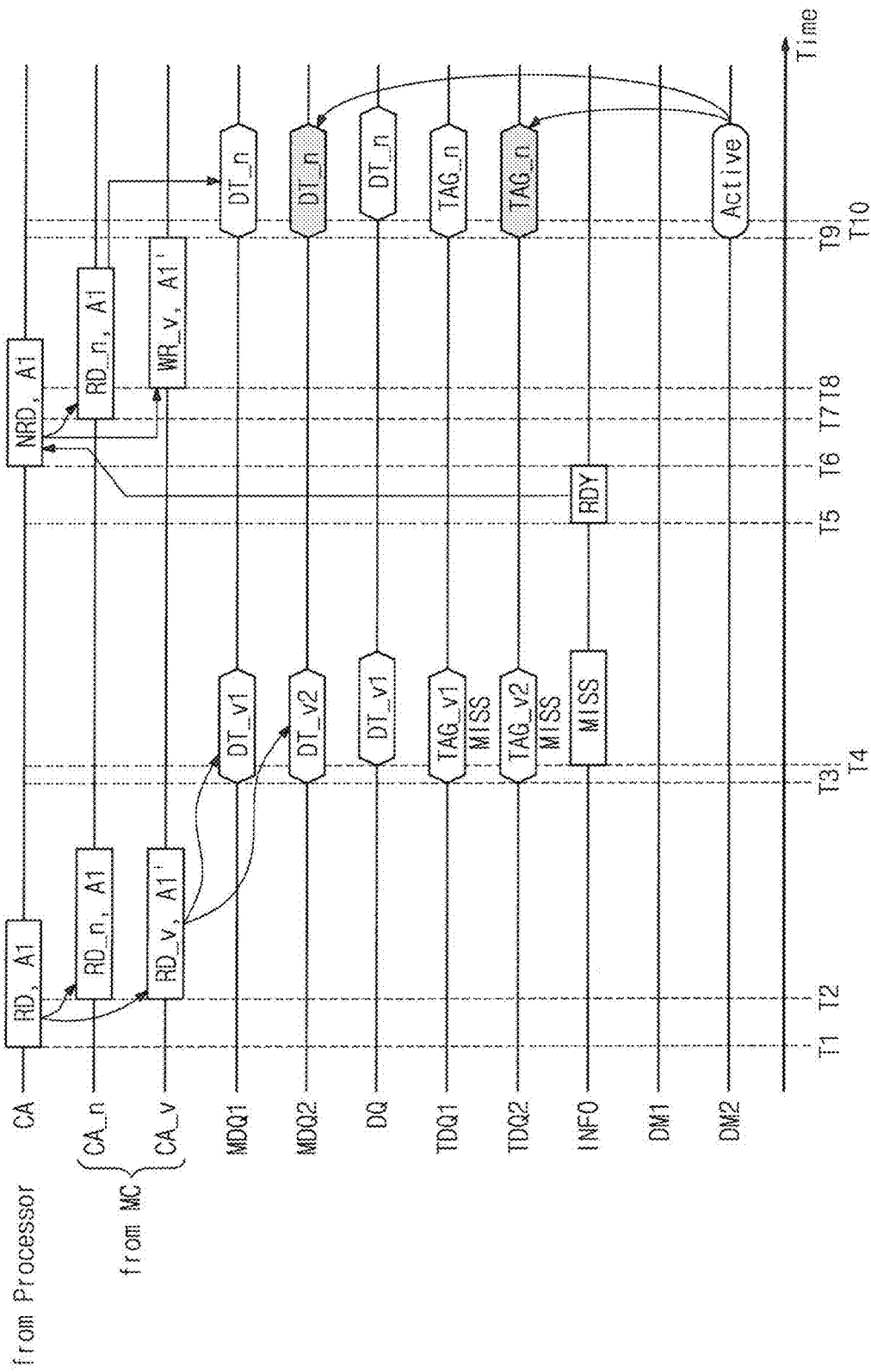
FIG. 9 is a timing diagram describing a read operation of FIG. 8 in detail.

FIG. 9 is a timing diagram describing the read operation of FIG. 8 in detail. In FIG. 9, the x-axis indicates time. For descriptive convenience, a duplicate description with respect to the above-described elements is omitted.

Referring to FIGS. 1, 2, 6, 8, and 9, at T1, the processor 101 may send a first module command/address CA to the nonvolatile memory module 100. For example, the first module command/address CA may include the module read command RD and a first address A1.

At T2, the module controller 110 may generate a first NVM command/address CA_n and a first VM command/address CA_v from the first module command/address CA. The first NVM command/address CA_n may include an NVM read command RD_n and the first address A1. The first VM command/address CA_v may include a VM read command RD_v and a first partial address A1'. The first partial address A1' may be a portion of the first address A1.

At T3, in response to the first VM read command RD_v and the first partial address A1', the volatile memory 121 may load first cache data DT_v1, which is read from the first region R1 by using the first partial address A1', on the first memory data lines MDQ1 and may load a first cache tag TAG_v1, which is read from the first region R1 by using the first partial address A1', on the first tag data lines TDQ1.

Also, in response to the first VM read command RD_v and the first partial address A1', the volatile memory 121 may load second cache data DT_v2, which is read from the second region R2 by using the first partial address A1', on the second memory data lines MDQ2 and may load a second cache tag TAG_v2, which is read from the second region R2 by using the first partial address A1', on the second tag data lines TDQ2.

The module controller 110 or the NVM controller 122 may determine the cache hit or the cache miss based on the first and second cache tags TAG_v1 and TAG_v2 loaded on the first and second tag data lines TDQ1 and TDQ2. In an embodiment illustrated in FIG. 9, it is assumed that the first cache tag TAG_vl and the second cache tag TAG_v2 are determined as a cache miss.

At T4, the data buffer 130 may output one of first cache data DT_v1 loaded on the first memory data lines MDQ1 and second cache data DT_v1 loaded on the second memory data lines MDQ2 through the data lines DQ under control of the module controller 110. An embodiment is exemplified in FIG. 9 which illustrates that the data buffer 130 outputs the first cache data DT_v1. However, embodiments are not limited thereto.

The cache information INFO indicating that the first cache data DT_v1 is invalid, that is, that a cache miss has been generated, may be output to the processor 101 together with the output of the first cache data DT_v1. The processor 101 may determine that the first cache data DT_v1 output through the data lines DQ is invalid, based on the cache information INFO.

As the cache miss is determined, the NVM controller 122 may read data from the nonvolatile memory 123 based on the first NVM read command RD_n and the first address A1. For example, a read operation that is performed based on the first NVM read command RD_n and the first address A1 may be the pre-read operation. When NVM data DT_n read from the nonvolatile memory 123 is prepared in the NVM controller 122, the NVM controller 122 may notify the module controller 110 that the pre-read operation is completed. For example, the NVM controller 122 may send a signal, which indicates that the pre-read operation is completed, to the module controller 110.

As the pre-read operation is completed, at T5, the module controller 110 may send the ready signal RDY to the processor 101. For example, the ready signal RDY may be output as the cache information INFO.

At T6, the processor 101 may send a second module command/address CA, which includes a second module read command NRD and a first address A1, to the nonvolatile memory module 100 in response to the ready signal RDY.

At T7, the module controller 110 may send a second NVM read command/address CA_n, which includes the NVM read command RD_n and the first address A1, to the NVM controller 122 in response to the second module command/address CA including a second module read command NRD and the first address A1.

At T8, the module controller 110 may send a second VM command/address CA_v, which includes the VM write command WR_v and the first partial address A1', to the volatile memory 121 in accordance with a time at which the NVM data DT_n will be loaded onto the first memory data lines MDQ1 and/or the second memory data lines MDQ2 from the NVM controller 122.

At T9, the NVM controller 122 may load the NVM data DT_n prepared therein on the first memory data lines MDQ1 and the second memory data lines MDQ2 respectively in response to the NVM read command RD_n and the first address A1. That is, the same NVM data DT_n may be loaded on the first memory data lines MDQ1 and the second memory data lines MDQ2.

The NVM controller 122 may load the NVM tag TAG_n corresponding to the NVM data DT_n on the first tag data lines TDQ1 and the second tag data lines TDQ2 respectively at a timing when the NVM data DT_n is loaded on the first memory data lines MDQ1 and the second memory data lines MDQ2. That is, the same NVM tag TAG_n may be loaded on the first tag data lines TDQ1 and the second tag data lines TDQ2. For example, the NVM tag TAG_n may be generated based on the first address A1. In detail, the NVM tag TAG_n may be generated by removing a portion, which corresponds to the first partial address A1', from the first address A1.

The module controller 122 may select and activate one of the first data mask signal DM1 and/or the second data mask signal DM2 at a timing when the NVM data DT_n is loaded on the first memory data lines MDQ1 and the second memory data lines MDQ2. For example, the module controller 110 may select and activate a data mask signal corresponding to data that is not at a dirty state, a data mask signal corresponding to data stored in the volatile memory 121 longer ago, or a data mask signal corresponding to a tag hit longer ago. In an embodiment illustrated in FIG. 9, it is assumed that the second data mask signal DM2 is activated.

When the NVM data DT_n is loaded and the first data mask signal DM1 is activated, the volatile memory 121 may perform a write operation in response to the VM write command WR_v and the first partial address A1'. For example, in the case where the first data mask signal DM1 is inactivated or remains at an inactive state, the volatile memory 121 may store the NVM data DT_n loaded on the first memory data lines MDQ1 and the NVM tag TAG_n loaded on the first tag data lines TDQ1 in the first region R1. In the case where the second data mask signal DM2 is activated, even though the VM write command WR_v and the first partial address A1' are issued at T8, the volatile memory 121 may not store the NVM data DT_n loaded on the second memory data lines MDQ2 and the NVM tag TAG_n loaded on the second tag data lines TDQ2 in the second region R2.

At T10, the data buffer 130 may output the NVM data DT_n loaded on the first memory data lines MDQ1 or the second memory data lines MDQ2 through the data lines DQ under control of the module controller 110.

As described above, when the cache miss is generated, the volatile memory 121 stores the NVM data DT_n read from the nonvolatile memory 123 and the NVM tag TAG_n corresponding to the NVM data DT_n. In this case, the NVM data DT_n and the NVM tag TAG_n are stored in one of a plurality of regions of the volatile memory 121 by using a data mask signal. Accordingly, the volatile memory 121 may operate as a multi-way set associative cache memory with respect to the nonvolatile memory 123.

Figure 10:
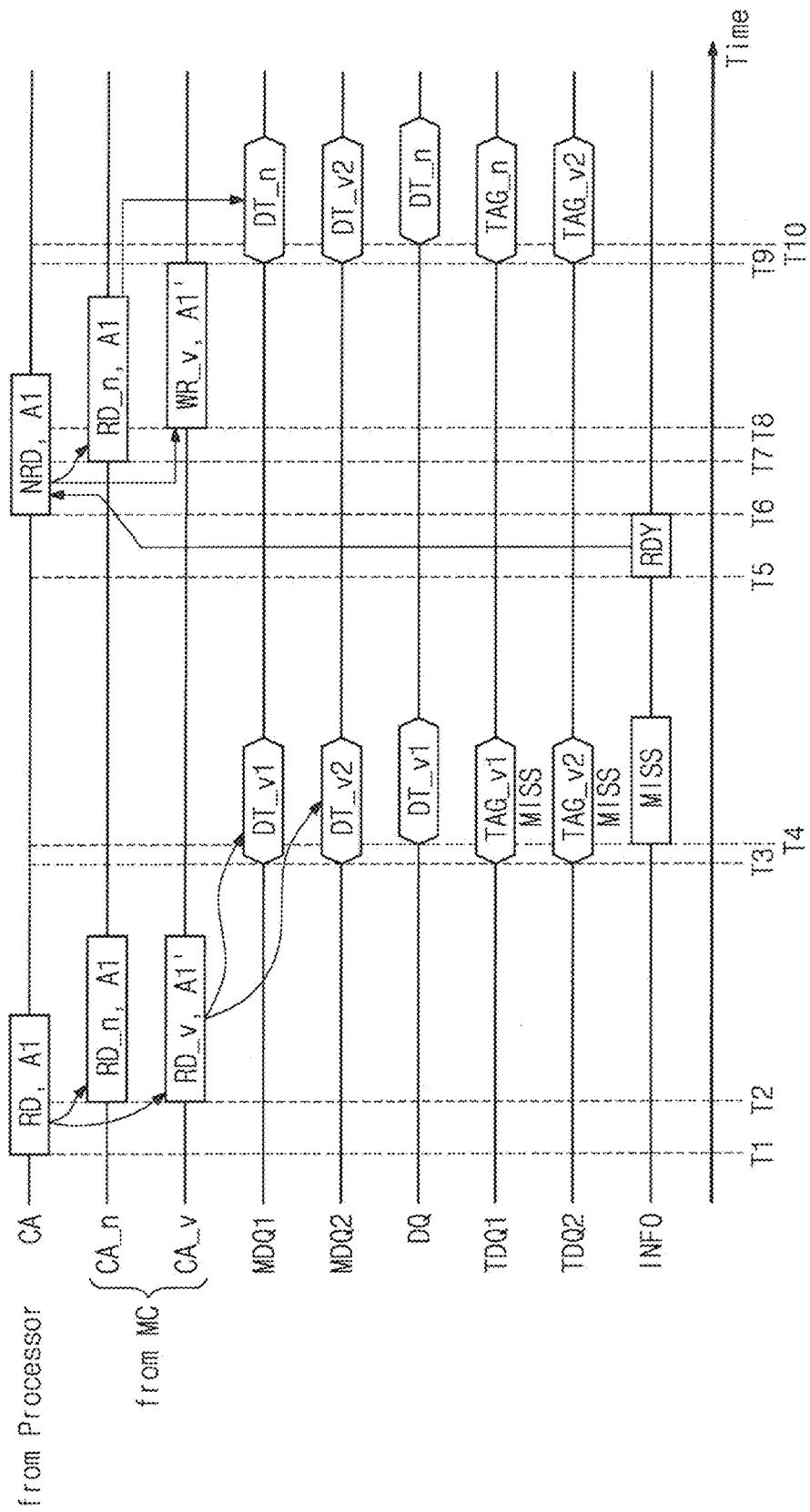
FIG. 10 is a timing diagram describing an application of a read operation of FIG. 8 in detail.

FIG. 10 is a timing diagram describing an application of the read operation of FIG. 8 in detail. In FIG. 10, the x-axis indicates time. For descriptive convenience, a duplicate description with respect to the above-described elements is omitted.

An operation of FIG. 10 that is performed from T1 when the module command/address CA is received to T8 when the VM command/address CA_v is output is the same as that of FIG. 9 from T1 when the module command/address CA is received to t8 when the VM command/address CA_v is output, and a description thereof is thus omitted.

Referring to FIGS. 1, 2, 6, 8, and 10, at T9, the NVM controller 122 may load the NVM data DT_n prepared therein on one selected from the first memory data lines MDQ1 and the second memory data lines MDQ2 in response to the NVM read command RD_n and the first address A1. For example, the NVM controller 122 or the module controller 110 may select memory data lines corresponding to data that is not at a dirty state, memory data lines corresponding to data stored in the volatile memory 121 longer ago, or memory data lines corresponding to a tag hit longer ago. In FIG. 10, it is assumed that the NVM controller 122 loads the NVM data DT_n on the first memory data lines MDQ1.

The module controller 110 may load the NVM tag TAG_n corresponding to the NVM data DT_n on the first tag data lines TDQ1 at a timing when the NVM data DT_n is loaded on the first memory data lines MDQ1. For example, the NVM tag TAG_n may be generated based on the first address A1. In detail, the NVM tag TAG_n may be generated by removing a portion, which corresponds to the first partial address A1', from the first address A1.

At a timing when the NVM data DT_n is loaded on the first memory data lines MDQ1, the data buffer 130 may again load the second cache data DT_v2, which was previously received through the second memory data lines MDQ2 back onto the second memory data lines MDQ2 under control of the module controller 110. That is to say that when the second memory data lines MDQ2 are not selected for update, the memory controller 110 loads the previously-accessed second cache data DT_v2 back onto the second memory data lines MDQ2 so as to leave the content of the second memory data lines MDQ2 associated with the first partial address A1' unchanged. Furthermore, the module controller 110 may again load the second cache data DT_v2, which was previously received through the second tag data lines TDQ2, back on the second tag data lines TDQ2.

At the timing when the NVM data DT_n is loaded on the first memory data lines MDQ1, the volatile memory 121 may perform a write operation in response to the VM write command WR_v and the first partial address A1'. For example, the volatile memory 121 may store the NVM data DT_n loaded on the first memory data lines MDQ1 and the NVM tag TAG_n loaded on the first tag data lines TDQ1 in the first region R1. The volatile memory 121 may store the second cache data DT_v2 loaded on the second memory data lines MDQ2 and the second cache tag TAG_v2 loaded on the second tag data lines TDQ2 in the second region R2. In other words, the first region R1 may be updated with the newly accessed NVM data DT_n and NVM tag TAG_n, while the contents of second region R2 may receive the same second cache data DT_v2 and second cache tag TAG_v2 that were contained previously in the second region R2.

At T10, the data buffer 130 may output the NVM data DT_n loaded on the first memory data lines MDQ1 through the data lines DQ under control of the module controller 110.

As described above, when the cache miss is generated, the volatile memory 121 stores pieces of data loaded on a plurality of memory data line groups and tags loaded on a plurality of tag data line groups. In this case, since previously read cache data and a previously read cache tag are again loaded on memory data lines and tag data lines on which the NVM data DT_n and the NVM tag TAG_n are not loaded, respectively, the NVM data DT_n and the NVM tag TAG_n are stored in one of a plurality of regions of the volatile memory 121. Accordingly, the volatile memory 121 may operate as a multi-way set associative cache memory with respect to the nonvolatile memory 123.

Figure 11:
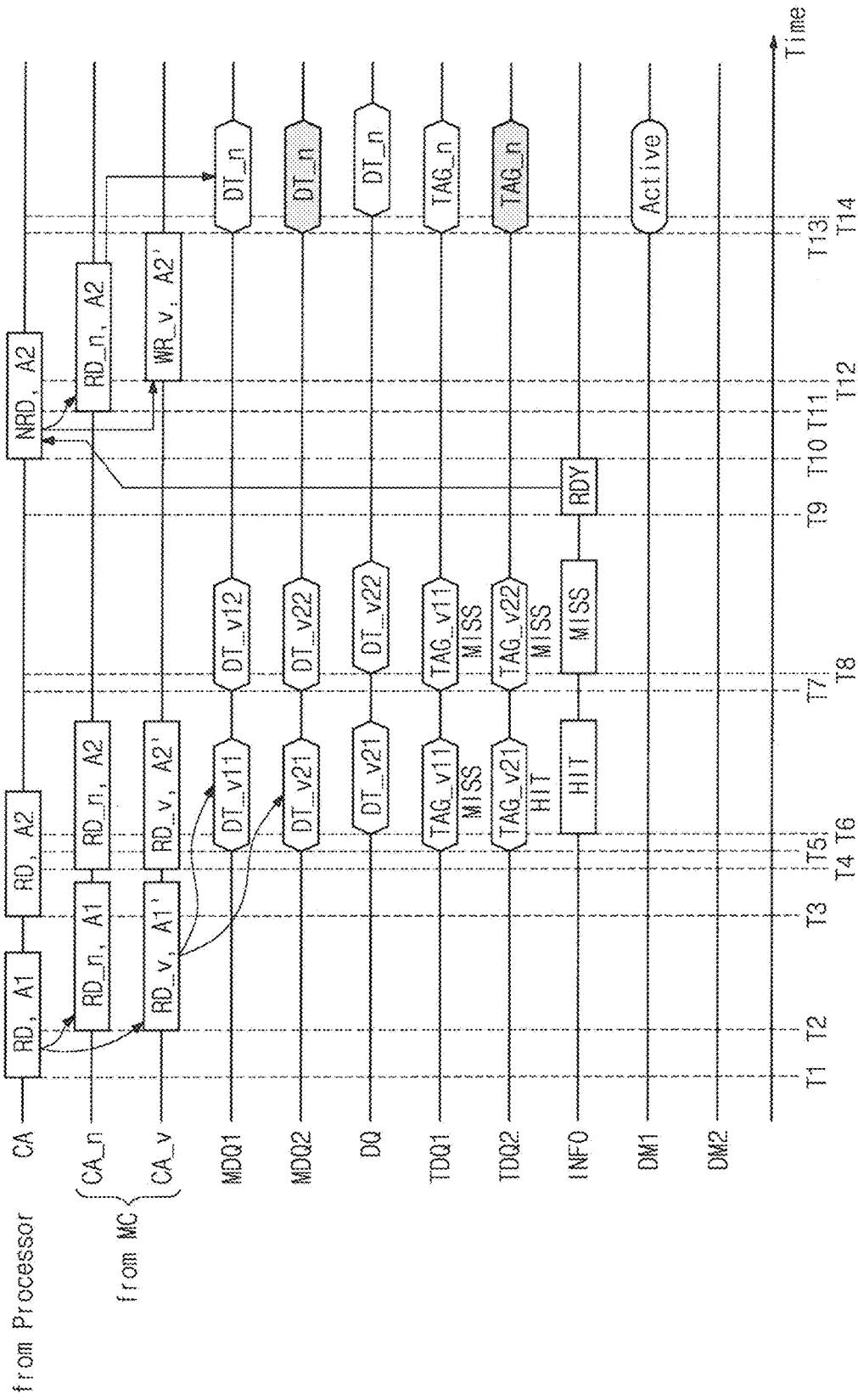
FIG. 11 is a timing diagram describing another application of a read operation of FIG. 8 in detail.

FIG. 11 is a timing diagram describing another application of the read operation of FIG. 8 in detail. In FIG. 11, the x-axis indicates time. For descriptive convenience, a duplicate description about the above-described elements may be omitted.

Referring to FIGS. 1, 2, 6, 8, and 11, at T1, the processor 101 may send a first module command/address CA to the nonvolatile memory module 100. For example, the first module command/address CA may include the module read command RD and a first address A1.

At T2, the module controller 110 may generate a first NVM command/address CA_n and a first VM command/address CA_v based on the first module command/address CA associated with the first address A1. The first NVM command/address CA_n may include an NVM read command RD_n and the first address A1. The first VM command/address CA_v may include a VM read command RD_v and a first partial address A1'. The first partial address A1' may be a portion of the first address A1.

Before a result of the module read command RD associated with the first address A1 is received from the nonvolatile memory module 100, at T3, the processor 101 may send a second module command/address CA, which includes a module read command RD and a second address A2, to the nonvolatile memory module 100.

At T4, the module controller 110 may generate a second NVM command/address CA_n and a second VM command/address CA_v based on the second module command/address CA associated with the second address A2. The second NVM command/address CA_n may include an NVM read command RD_n and the second address A2. The second VM command/address CA_v may include a VM read command RD_v and a second partial address A2'. The second partial address A2' may be a portion of the second address A2.

At T5, in response to the VM read command RD_v and the first partial address A1' of the first VM command/address CA_v, the volatile memory 121 may load 11th cache data DT_v11, which is read from the first region R1 by using the first partial address A1', on the first memory data lines MDQ1 and may load an 11th cache tag TAG_v11, which is read from the first region R1 by using the first partial address A1', on the first tag data lines TDQ1.

Also, in response to the VM read command RD_v and the first partial address A1' of the first VM command/address CA_v, the volatile memory 121 may load 21st cache data DT_v21, which is read from the second region R2 by using the first partial address A1', on the second memory data lines MDQ2 and may load a 21st cache tag TAG_v21, which is read from the second region R2 by using the first partial address A1', on the second tag data lines TDQ2.

The module controller 110 or the NVM controller 122 may determine a cache hit or a cache miss based on the 11th and 21st cache tags TAG_v11 and TAG_v21 loaded on the first and second tag data lines TDQ1 and TDQ2. In an embodiment illustrated in FIG. 11, it is assumed that the 21st cache tag TAG_v21 is determined as a cache hit and the 11th cache tag TAG_v11 is determined as a cache miss.

At T6, the data buffer 130 may output the 21st cache data DT_v21, which is loaded on the second memory data lines MDQ2 corresponding to the 21st cache tag TAG_v21 where the cache hit is generated, through the data lines DQ under control of the module controller 110.

The cache information INFO indicating that the 21st cache data DT_v21 is valid, that is, that the cache hit is generated, may be output to the processor 101 together with the output of the 21st cache data DT_v21. The processor 101 may determine that the 21st cache data DT_v21 output through the data lines DQ is valid, based on the cache information INFO.

At T7, in response to the VM read command RD_v and the second partial address A2' of the second VM command/address CA_v, the volatile memory 121 may load 12th cache data DT_v12, which is read from the first region R1 by using the second partial address A2', on the first memory data lines MDQ1 and may load a 12th cache tag TAG_v12, which is read from the first region R1 by using the second partial address A2', on the first tag data lines TDQ1.

Also, in response to the VM read command RD_v and the second partial address A2' of the second VM command/address CA_v, the volatile memory 121 may load 22nd cache data DT_v22, which is read from the second region R2 by using the second partial address A2', on the second memory data lines MDQ2 and may load a 22nd cache tag TAG_v22, which is read from the second region R2 by using the second partial address A2', on the second tag data lines TDQ2.

The module controller 110 or the NVM controller 122 may determine the cache hit or the cache miss based on the 12th and 22nd cache tags TAG_v12 and TAG_v22 loaded on the first and second tag data lines TDQ1 and TDQ2. In an embodiment illustrated in FIG. 11, it is assumed that the 12th and 22nd cache tags TAG_v12 and TAG_v22 are determined as a cache miss.

At T8, the data buffer 130 may output one of the 12th cache data DT_v12 loaded on the first memory data lines MDQ1 and the 22nd cache data DT_v22 loaded on the second memory data lines MDQ2 through the data lines DQ. In an embodiment illustrated in FIG. 11, the data buffer 130 outputs the 22nd cache data DT_v22. However, embodiments of the inventive concepts are not limited thereto.

The module controller 110 may output the cache information INFO indicating that the first cache data DT_v22 is invalid, that is, that the cache miss is generated, to the processor 101 together with the output of the 22nd cache data DT_v22. The processor 101 may determine that the 22nd cache data DT_v22 output through the data lines DQ is invalid, based on the cache information INFO.

As the cache miss is determined, the NVM controller 122 may read data from the nonvolatile memory 123 based on the NVM read command RD_n and the second address A2. For example, a read operation that is performed based on the NVM read command RD_n and the second address A2 may be a pre-read operation. When NVM data DT_n read from the nonvolatile memory 123 is prepared in the NVM controller 122, the NVM controller 122 may notify the module controller 110 that the pre-read operation is completed. For example, the NVM controller 122 may send a signal, which indicates that the pre-read operation is completed, to the module controller 110.

As the pre-read operation is completed, at T9, the module controller 110 may send the ready signal RDY to the processor 101. For example, the ready signal RDY may be output as the cache information INFO.

At T10, the processor 101 may send a third module command/address CA, which includes a module read command NRD and the second address A2, to the nonvolatile memory module 100 in response to the ready signal RDY.

At T11, the module controller 110 may send a third NVM command/address CA_n, which includes the NVM read command RD_n and the second address A2, to the NVM controller 122 in response to the third module command/address CA including the module read command NRD and the second address A2.

At T12, the module controller 110 may send a third VM command/address CA_v, which includes the VM write command WR_v and the second partial address A2', to the volatile memory 121 in accordance with a time at which the NVM data DT_n is loaded onto the first memory data lines MDQ1 or the second memory data lines MDQ2 from the NVM controller 122.

At T13, the NVM controller 122 may load the NVM data DT_n prepared therein on the first memory data lines MDQ1 and the second memory data lines MDQ2 respectively in response to the NVM read command RD_n and the second address A2 of the third NVM command/address CA_n. The NVM controller 122 may load the NVM tag TAG_n corresponding to the NVM data DT_n on the first tag data lines TDQ1 and the second tag data lines TDQ2 respectively at a timing when the NVM data DT_n is loaded on the first memory data lines MDQ1 and the second memory data lines MDQ2.

The module controller 122 may select and activate one of the first data mask signal DM1 and the second data mask signal DM2 at a timing when the NVM data DT_n is loaded on the first memory data lines MDQ1 and the second memory data lines MDQ2.

When the NVM data DT_n is loaded and the first data mask signal DM1 is activated, the volatile memory 121 may perform a write operation in response to the NVM write command WR_v and the second partial address A2' of the third VM command/address CA_v. For example, in the case where the first data mask signal DM1 is inactivated or remains at an inactive state, the volatile memory 121 may store the NVM data DT_n loaded on the first memory data lines MDQ1 and the NVM tag TAG_n loaded on the first tag data lines TDQ1 in the first region R1. When the second data mask signal DM2 is inactivated or remains at an inactive state, the volatile memory 121 may store the NVM data DT_n loaded on the first memory data lines MDQ2 and the NVM tag TAG_n loaded on the second tag data lines TDQ2 in the second region R2.

At T14, the data buffer 130 may output the NVM data DT_n loaded on the first memory data lines MDQ1 or the second memory data lines MDQ2 through the data lines DQ under control of the module controller 110.

As described above, even though the processor 101 issues the first, second, and third module commands/addresses CA consecutively without a response of the nonvolatile memory module 100, the volatile memory 121 may operate as a multi-way set associative cache with respect to the nonvolatile memory 123.

Figure 12:
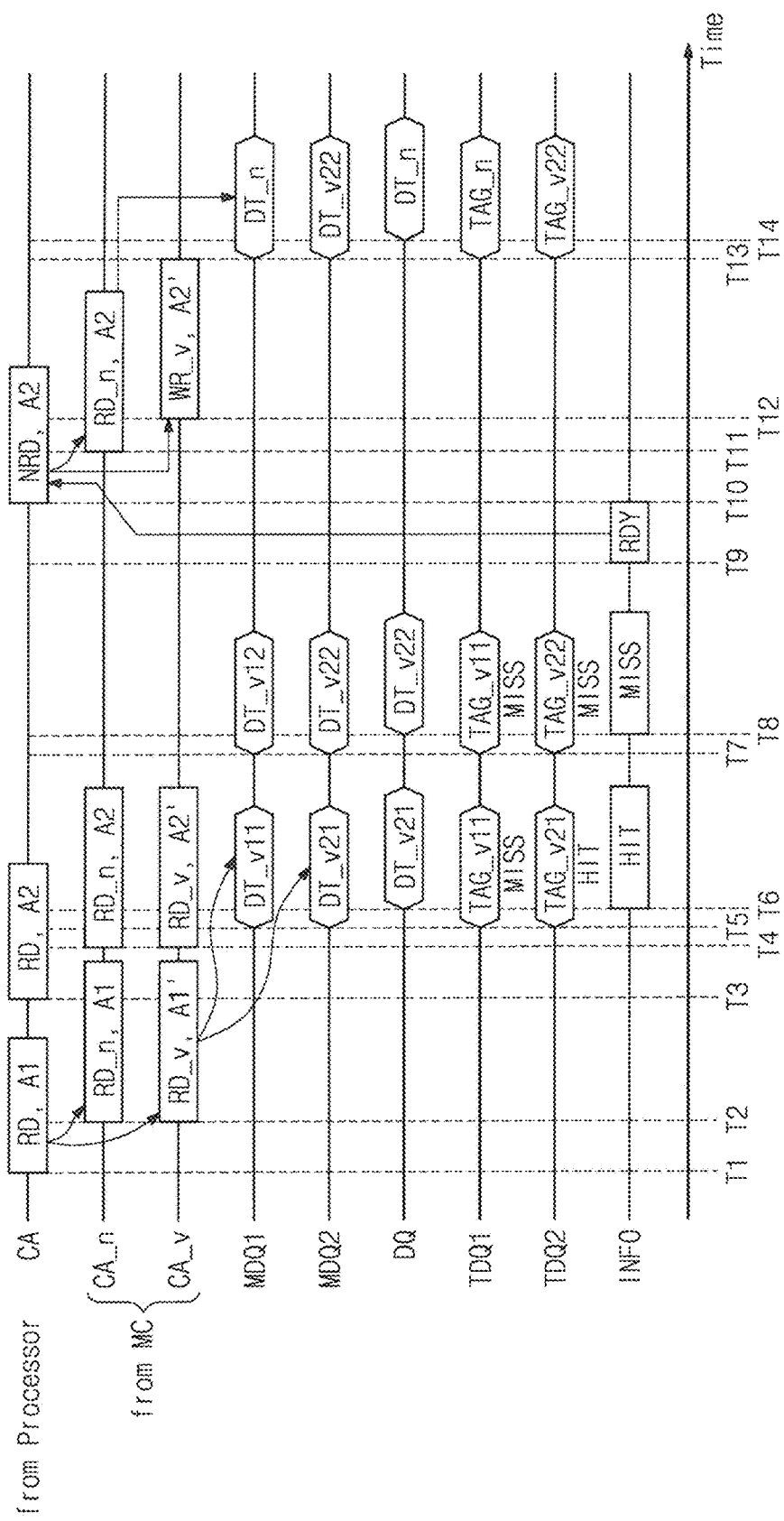
FIG. 12 is a timing diagram describing a further application of a read operation of FIG. 8 in detail.

FIG. 12 is a timing diagram describing a further application of the read operation of FIG. 8 in detail. In FIG. 12, the x-axis indicates time. For descriptive convenience, a duplicate description about the above-described elements may be omitted.

An operation of FIG. 12 that is performed from T1 when the first module command/address CA is received to T12 when the third VM command/address CA_v is output is the same as that of FIG. 11 from T1 when the first module command/address CA is received to T12 when the third VM command/address CA_v is output, and a description thereof is thus omitted.

Referring to FIGS. 1, 2, 6, 8, and 12, at T13, the NVM controller 122 may load the NVM data DT_n prepared therein on one selected from the first memory data lines MDQ1 and the second memory data lines MDQ2 in response to the NVM read command RD_n and the second address A2 of the third NVM command/address CA_n. In FIG. 12, it is assumed that the NVM controller 122 loads the NVM data DT_n on the first memory data lines MDQ1.

The module controller 110 may load the NVM tag TAG_n corresponding to the NVM data DT_n on the first tag data lines TDQ1 at a timing when the NVM data DT_n is loaded on the first memory data lines MDQ1. For example, the NVM tag TAG_n may be generated based on the second address A2.

At a timing when the NVM data DT_n is loaded on the first memory data lines MDQ1, the data buffer 130 may again load the second cache data DT_v2, which was previously received through the second memory data lines MDQ2 on which no NVM data DT_n is loaded, on the second memory data lines MDQ2 under control of the module controller 110. Furthermore, the module controller 110 may again load the second cache data DT_v2, which was previously received through the second tag data lines TDQ2, on the second tag data lines TDQ2.

At a timing when the NVM data DT_n is loaded on the first memory data lines MDQ1, the volatile memory 121 may perform a write operation in response to the VM write command WR_v and the second partial address A2' of the third VM command/address CA_v. For example, the volatile memory 121 may store the NVM data DT_n loaded on the first memory data lines MDQ1 and the NVM tag TAG_n loaded on the first tag data lines TDQ1 in the first region R1. The volatile memory 121 may store the second cache data DT_v2 loaded on the second memory data lines MDQ2 and the second cache tag TAG_v2 loaded on the second tag data lines TDQ2 in the second region R2.

At T14, the data buffer 130 may output the NVM data DT_n loaded on the first memory data lines MDQ1 through the data lines DQ under control of the module controller 110.

As described above, even though the processor 101 issues the first, second, and third module commands/addresses CA consecutively without a response of the nonvolatile memory module 100, the volatile memory 121 may operate as a multi-way set associative cache with respect to the nonvolatile memory 123.

Figure 13:
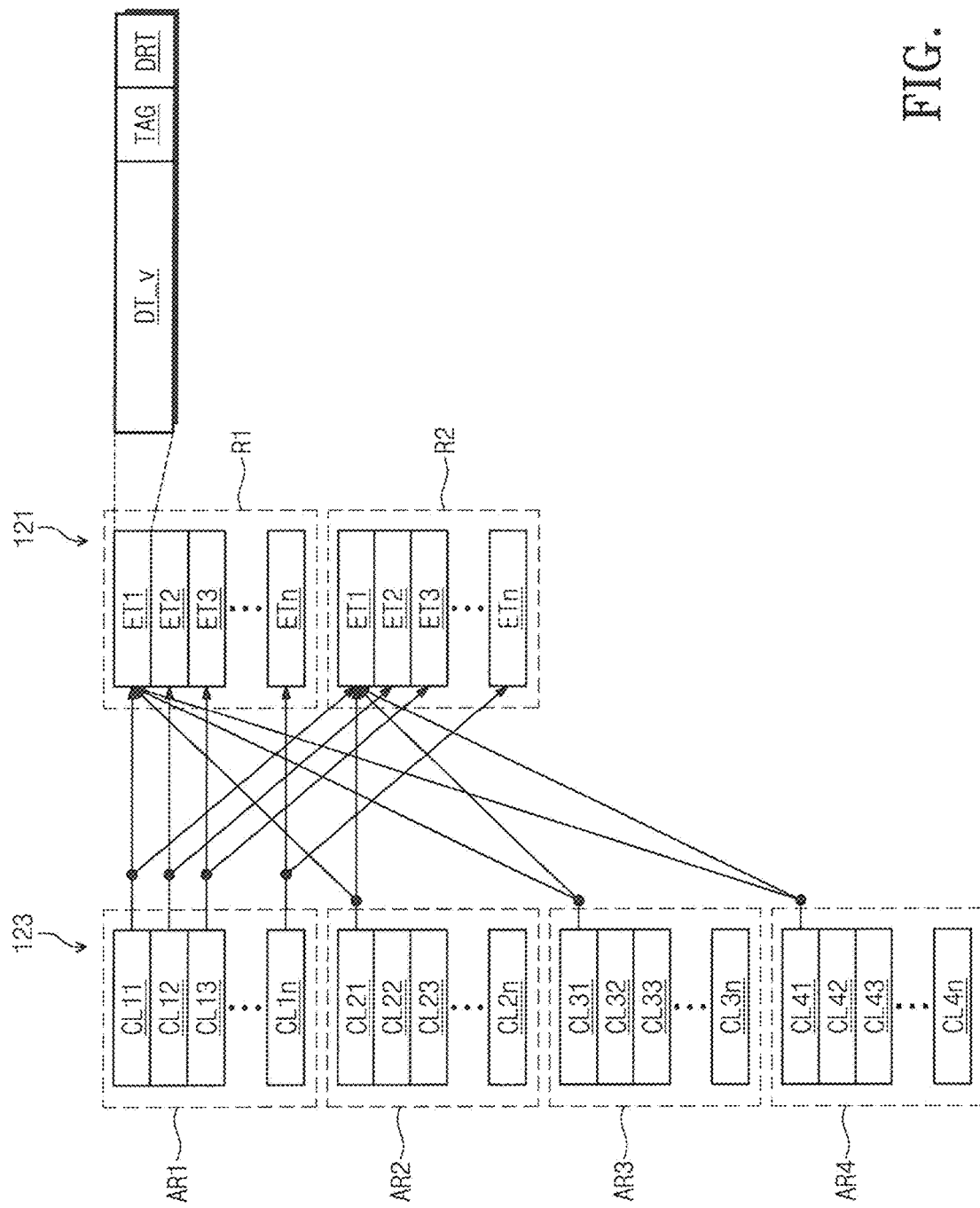
FIG. 13 illustrates a cache structure of a volatile memory of FIG. 2.

FIG. 13 illustrates a cache structure of the volatile memory 121 of FIG. 2. For descriptive convenience, elements which are not used to describe a cache structure of the volatile memory 121 may be omitted. Furthermore, it is assumed that a storage region of the nonvolatile memory 123 is divided into first to fourth regions AR1 to AR4. The first to fourth regions AR1 to AR4 may be regions that are logically divided. The storage region of the nonvolatile memory 123 may further include a storage space as well as the first to fourth regions AR1 to AR4. Furthermore, it is assumed that a storage region of the volatile memory 121 is divided into first to second regions R1 to R2.

Referring to FIGS. 2 and 13, an access speed of the volatile memory 121 may be faster than that of the nonvolatile memory 123. That is, a portion of data stored in the nonvolatile memory 123 may also be stored in the volatile memory 121 so that a speed with which an access operation is performed according to a request of the module controller 110 or the processor 101 may be improved. For example, the volatile memory 121 may be used as a cache memory of the nonvolatile memory 123. For example, the volatile memory 121 may store a portion of data also stored in the nonvolatile memory 123 and may output the stored data in response to a request of the module controller 110 or the processor 101.

In some embodiments, the volatile memory 121 may operate as a multi-way set associative cache of the nonvolatile memory 123. For example, each of the first and second regions R1 and R2 of the volatile memory 121 may include a plurality of entries ET1 to ETn. One entry ET may be a cache line corresponding to a cache unit and may indicate a storage space in which data and a tag are stored. The cache line may be a minimum access unit of a request of the module controller 110 or the processor 101. Each of the first and second regions R1 and R2 of the volatile memory 121 may have a storage capacity that corresponds to a sum of capacities of the entries ET1 to ETn.

The nonvolatile memory 123 may include the first to fourth regions AR1 to AR4. The first region AR1 may include a plurality of cache lines CL11 to CL1n, the second region AR2 may include a plurality of cache lines CL21 to CL2n, the third region AR3 may include a plurality of cache lines CL31 to CL3n, and the fourth region AR4 may include a plurality of cache lines CL41 to CL4n. In some embodiments, each of the cache lines CL11 to CL1n, CL21 to CL2n, CL31 to CL3n, and CL41 to CL4n may indicate a storage space that corresponds to a data access unit of a request of the processor 101 or the module controller 110.

For example, the first region AR1 may include the cache lines CL11 to CL1n. The cache lines CL11 to CL1n may correspond to the entries ET1 to ETn of each of the first and second regions R1 and R2, respectively. That is, the first cache line CL11 may correspond to the first entry ET1, and the second cache line CL12 may correspond to the second entry ET2. The second region AR2 may include the cache lines CL21 to CL2n, which correspond to the plurality of entries ET1 to ETn of each of the first and second regions R1 and R2, respectively. Likewise, the third region AR3 may include the cache lines CL31 to CL3n, which correspond to the plurality of entries ET1 to ETn of each of the first and second regions R1 and R2, respectively. The fourth area AR4 may include the cache lines CL41 to CL4n, which correspond to the plurality of entries ET1 to ETn of each of the first and second regions R1 and R2, respectively.

Each entry may include a tag associated with stored data DT_v. In some embodiments, the tag may be information indicating whether the cache data DT_v stored in each entry corresponds to any one of the cache lines CL11, CL21, CL31, and CL41 of the first to fourth regions AR1 to AR4.

Each entry may further include dirty information DRT associated with stored data. For example, the dirty information DRT may indicate whether an update was generated to the entry after cache data DT_v was stored in each entry. In the case where the update was generated, the dirty information DRT may be set to indicate a dirty state. In the case where the update was not generated, the dirty information DRT may be set to indicate a clean state.

In some embodiments, each of the cache lines CL11 to CL1n, CL21 to CL2n, CL31 to CL3n, and CL4 to CL4n may be selected or distinguished by an address "A" provided from the processor 101. That is, at least one of the plurality of cache lines CL11 to CL1n, CL21 to CL2n, CL31 to CL3n, and CL41 to CL4n may be selected by the address "A" provided from the processor 101, and an access operation may be performed with respect to the selected cache line.

Each of the plurality of entries ET1 to ETn may be selected or distinguished by at least a portion (e.g., a partial address) of the address "A" provided from the processor 101. That is, in each of the first and second regions R1 and R2, at least one of the plurality of entries ET1 to ETn may be selected by at least a part of the address "A" provided from the processor 101, and an access operation may be performed with respect to the selected entry.

The tag may include at least a portion of the address "A" provided from the processor 101 or the remaining portion thereof. For example, when at least one of the plurality of entries ET1 to ETn in each of the first and second regions R1 and R2 is selected by at least a portion of the address "A," and at least one of tags TAG_v from the selected entries is included in the address "A," then the selected entry containing the matching tag TAG_v may be determined as being a cache hit. Alternatively, when at least one of the plurality of entries ET1 to ETn in each of the first and second regions R1 and R2 is selected by at least a portion of the address "A," and at least one of tags TAG_v from the selected entries is not included in the address "A," the selected entries from the first and second regions R1 and R2 may be determined as being a cache miss.

As described above, the nonvolatile memory module 100 may use the volatile memory 121 as a cache memory, thereby improving the performance of the nonvolatile memory module 100. In this case, the nonvolatile memory module 100 may determine whether a cache hit or a cache miss is generated, based on tags TAG stored in the volatile memory 121.

Figure 14:
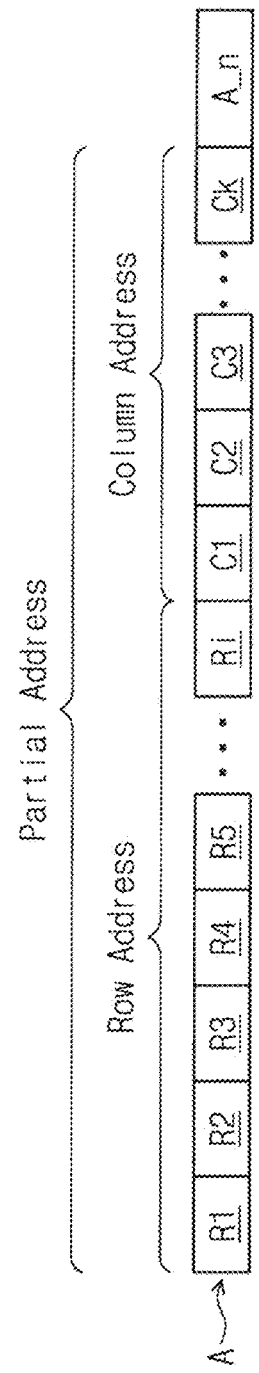
FIG. 14 illustrates a tag of FIG. 13 in detail.

FIG. 14 illustrates a tag of FIG. 13 in detail. Referring to FIGS. 1, 2, and 14, an address "A" provided from the processor 101 may include a row address, a column address, and an NVM extended address A_n. The row address may include a plurality of row bits R1 to Ri, and the column address may include a plurality of column bits C1 to Ck. In some embodiments, a read target, that is, an entry may be selected from each of the first and second regions R1 and R2 of the volatile memory 121, based on the plurality of row bits R1 to Ri and the plurality of column bits C1 to Ck. The row address and the column address may constitute a partial address that is used to access the volatile memory 121. Furthermore, a read target, that is, a cache line may be selected from each of the storage regions AR1 to AR4 of the nonvolatile memory 123, based on the plurality of row bits R1 to Ri and the plurality of column bits C1 to Ck.

The nonvolatile extended address A_n may be used to select one of the storage regions AR1 to AR4 of the nonvolatile memory 123 as a read target.

In some embodiments, the tag "TAG" may include the nonvolatile extended address A_n.

In some embodiments of the inventive concepts, a configuration of an address according to embodiments of the inventive concepts is not limited to the address "A" illustrated in FIG. 14. For example, the address "A" from the processor 101 may further include a chip address, a bank address, a row address, and/or a column address. In some embodiments of the inventive concepts, the address "A" from the processor 101 may be changed to have various address formats.

Furthermore, a configuration of the tag "TAG" according to embodiments of the inventive concepts is not limited to the tag "TAG" illustrated in FIG. 14. The tag "TAG" may include at least a portion of the address "A." In this case, the at least a portion of the address "A" may include some of the plurality of row bits R1 to Ri, some of the plurality of column bits C1 to Ck, or a combination thereof.

Figure 15:
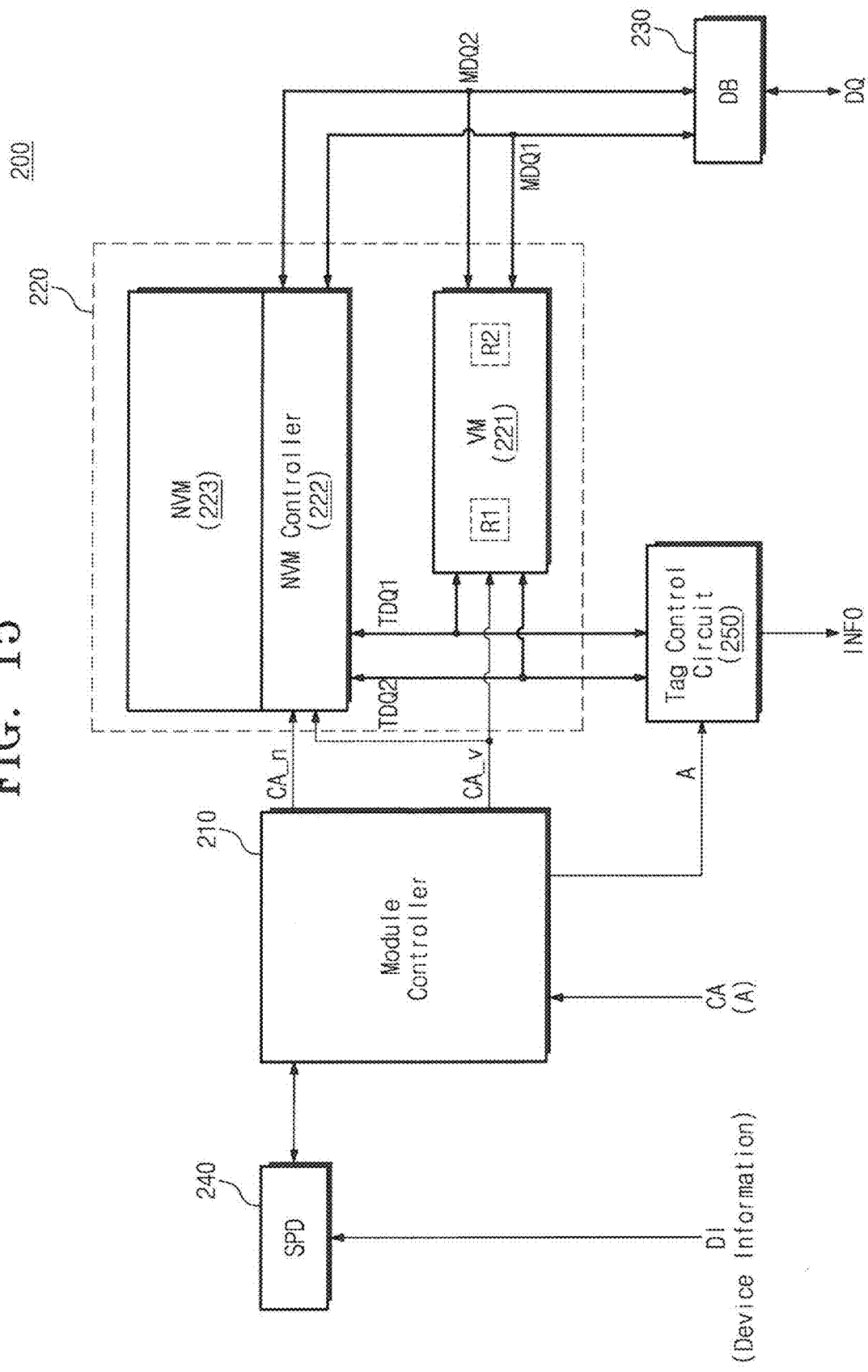
FIG. 15 illustrates an application of a nonvolatile memory module of FIG. 2.

FIG. 15 illustrates an application of the nonvolatile memory module 100 of FIG. 2. Referring to FIGS. 1 and 15, a nonvolatile memory module 200 may include a module controller 210, a volatile memory 221, an NVM controller 222, a nonvolatile memory 223, a data buffer 230, an SPD 240, and a tag control circuit 250. The volatile memory 221, the NVM controller 222, and the nonvolatile memory 223 may constitute a heterogeneous memory device 220. Compared to the nonvolatile memory modules 100 of FIG. 2, the nonvolatile memory module 200 may further include the tag control circuit 250.

The module controller 210 may send an address "A" of a module command/address CA from the processor 101 to the tag control circuit 250. The tag control circuit 250 may determine a cache hit or a cache miss by comparing the address "A" from the module controller 210 with cache tags TAG_v1 and TAG_v2 loaded on the first and second tag data lines TDQ1 and TDQ2. Also, the module controller 250 may output the cache information INFO indicating the cache hit or the cache miss to the processor 101.

The tag control circuit 250 may generate the write tag TAG_w or the NVM tag TAG_n based on the address "A" and may load the write tag TAG_w or the NVM tag TAG_n on the first tag data lines TDQ1 or the second tag data lines TDQ2.

The tag control circuit 250 may store the cache tag TAG_v1 received through the first tag data lines TDQ1 and may also load the stored cache tag TAG_v1 on the first tag data lines TDQ1. Furthermore, the tag control circuit 250 may store the cache tag TAG_v2 received through the second tag data lines TDQ2 and may also load the stored cache tag TAG_v2 on the second tag data lines TDQ2.

In some embodiments, the tag control circuit 250 may be configured to perform operations of FIGS. 1 to 14, which are described with regard to a tag as being performed by the module controller 110 or the NVM controller 122, instead of the module controller 110 or the NVM controller 122.

Figure 16:
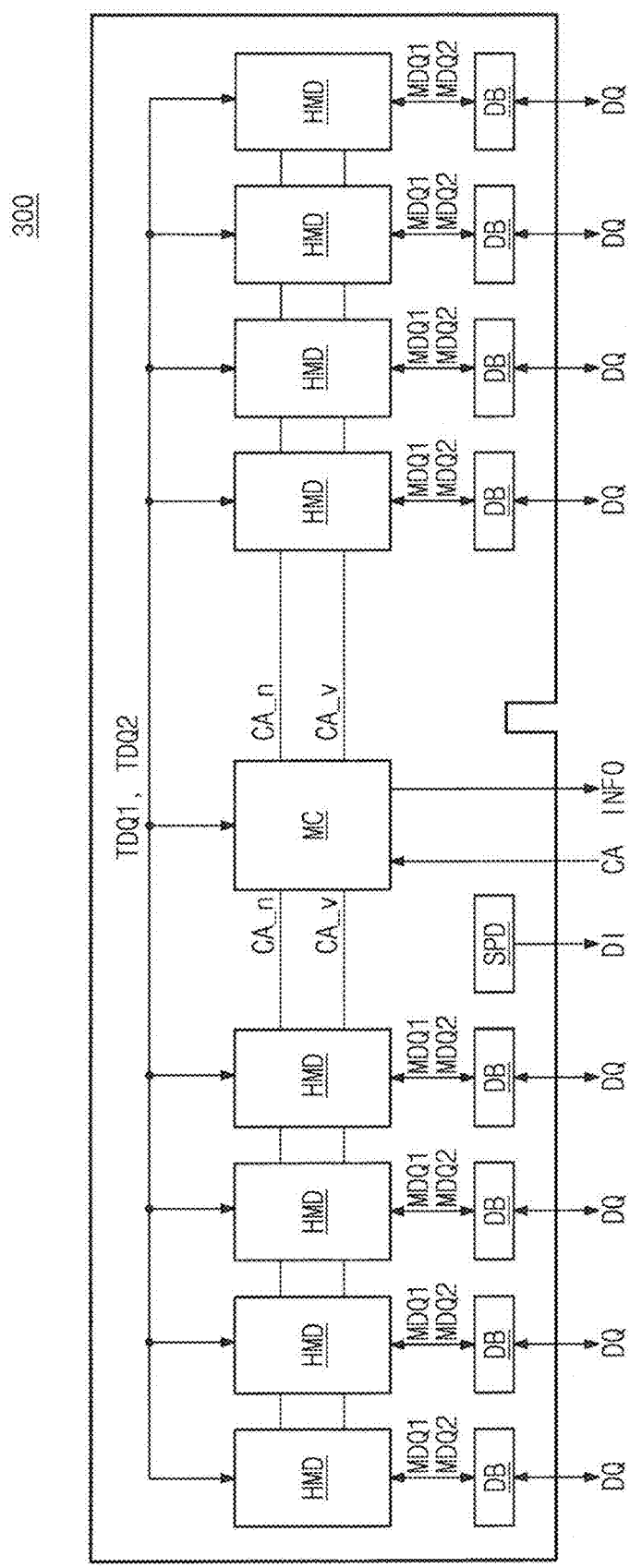
FIG. 16 is a block diagram illustrating a nonvolatile memory module of FIG. 2 according to other embodiments of the inventive concepts.

FIG. 16 is a block diagram illustrating the nonvolatile memory 100 module of FIG. 2, according to another embodiment of the inventive concepts. Referring to FIGS. 1 and 16, a nonvolatile memory module 300 may include a module controller MC, a plurality of heterogeneous memory devices HMD, a plurality of data buffers DB, and an SPD. For descriptive convenience, a detailed description about above-described components may be omitted. In some embodiments, the nonvolatile memory module 300 illustrated in FIG. 16 may have a load reduced dual in-line memory module (LRDIMM) structure.

The module controller MC may receive a module command/address CA from the processor 101 and may provide each of the heterogeneous memory devices HMD with a VM command/address CA_v and an NVM command/address CA_n in response to the received signal.

Each of the heterogeneous memory devices HMD may be a heterogeneous memory device 120 or 220 including the nonvolatile memory 121 or 221, the NVM controller 122 or 222, and the nonvolatile memory 123 or 223 described with reference to FIGS. 2 to 15. As described with reference to FIG. 15, each of the heterogeneous memory devices HMD may further include the tag control circuit 250.

For example, each of the heterogeneous memory devices HMD may be connected with a corresponding one of the data buffers DB through the first and second memory data lines MDQ1 and MDQ2. Each data buffer DB may communicate with an external device through data lines DQ corresponding thereto. Each of the heterogeneous memory devices HMD may communicate with the module controller MC through the first and second memory data lines TDQ1 and TDQ2. The module controller MC may generate the VM command/address CA_v and the NVM command/address CA_n based on the module command/address CA and may send them to the heterogeneous memory devices HMD. The tag control circuit 250 within each of the heterogeneous memory devices HMD may determine a cache hit or a cache miss based on the cache tags TAG_v1 and TAG_v2 loaded on the first and second tag data lines TDQ1 and TDQ2. The module controller MC may output the determination result (i.e., the cache hit or the cache miss) through the cache information INFO.

In some embodiments, as described with reference to FIG. 15, the tag control circuit 250 may be implemented separately from the heterogeneous memory devices HMD and the module controller MC.

Figure 17:
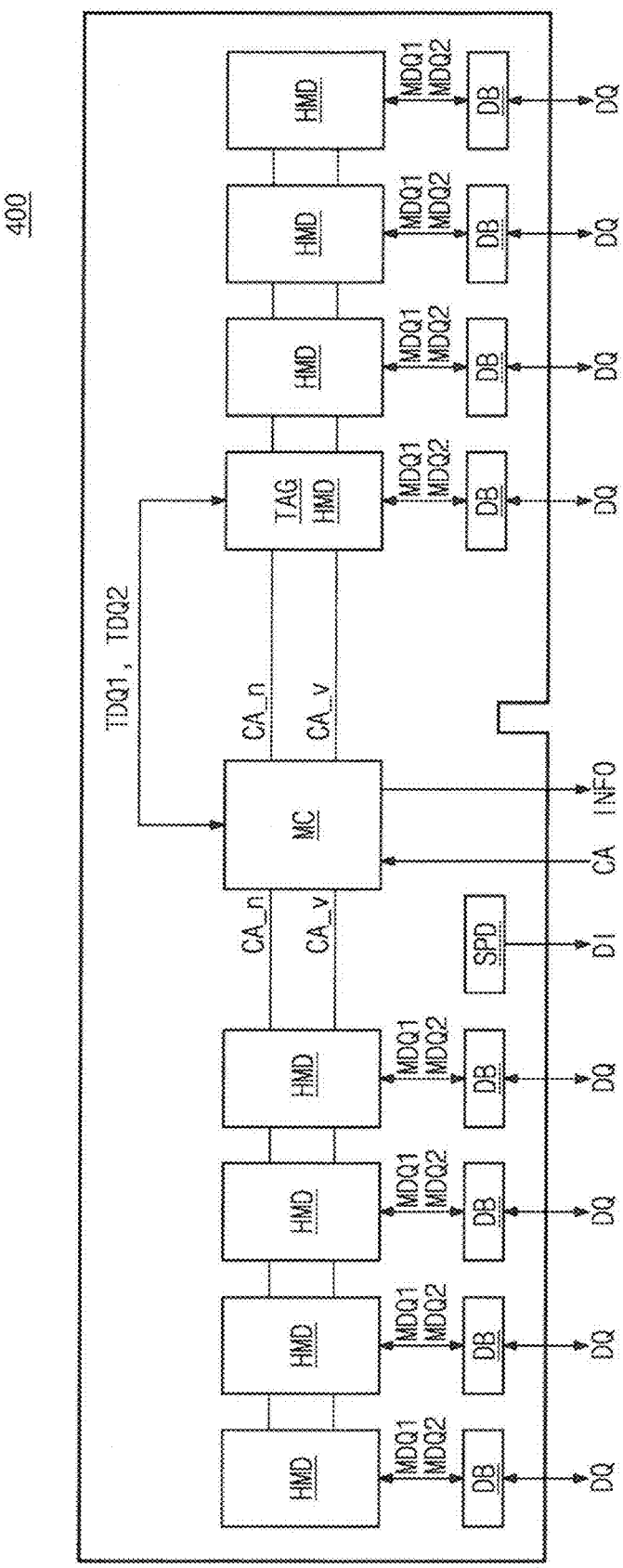
FIG. 17 is a block diagram illustrating a nonvolatile memory module of FIG. 2 according to other embodiments of the inventive concepts.

FIG. 17 is a block diagram illustrating the nonvolatile memory module 100 of FIG. 2, according to another embodiment of the inventive concepts. Referring to FIGS. 1 and 17, a nonvolatile memory module 400 may include the module controller MC, the plurality of heterogeneous memory devices HMD, a tag dedicated heterogeneous memory device TAG HMD, the plurality of data buffers DB, and the SPD. For descriptive convenience, a detailed description of the above-described elements is omitted. In some embodiments, the nonvolatile memory module 400 of FIG. 17 may have an LRDIMM structure.

Unlike the nonvolatile memory module 300 of FIG. 16, the nonvolatile memory module 400 of FIG. 17 includes the tag dedicated memory device TAG HMD. Each of the plurality of heterogeneous memory devices HMD may be configured to store pieces of cache data DT_v1 and DT_v2 and may not be connected with the tag data line TDQ. The tag dedicated heterogeneous memory device TAG HMD may include the volatile memory 121 or 221, the NVM controller 122 or 222, and the nonvolatile memory 123 or 223 described with reference to FIGS. 2 to 15. That is, the tag dedicated heterogeneous memory device TAG HMD may be configured to store and output cache tags TAG_v1 and TAG_v2 based on the VM command/address CA_v of the module controller MC. In this case, the tag dedicated heterogeneous memory device TAG HMD may be configured to share the first and second tag data lines TDQ1 and TDQ2 with the module controller MC.

Figure 18:
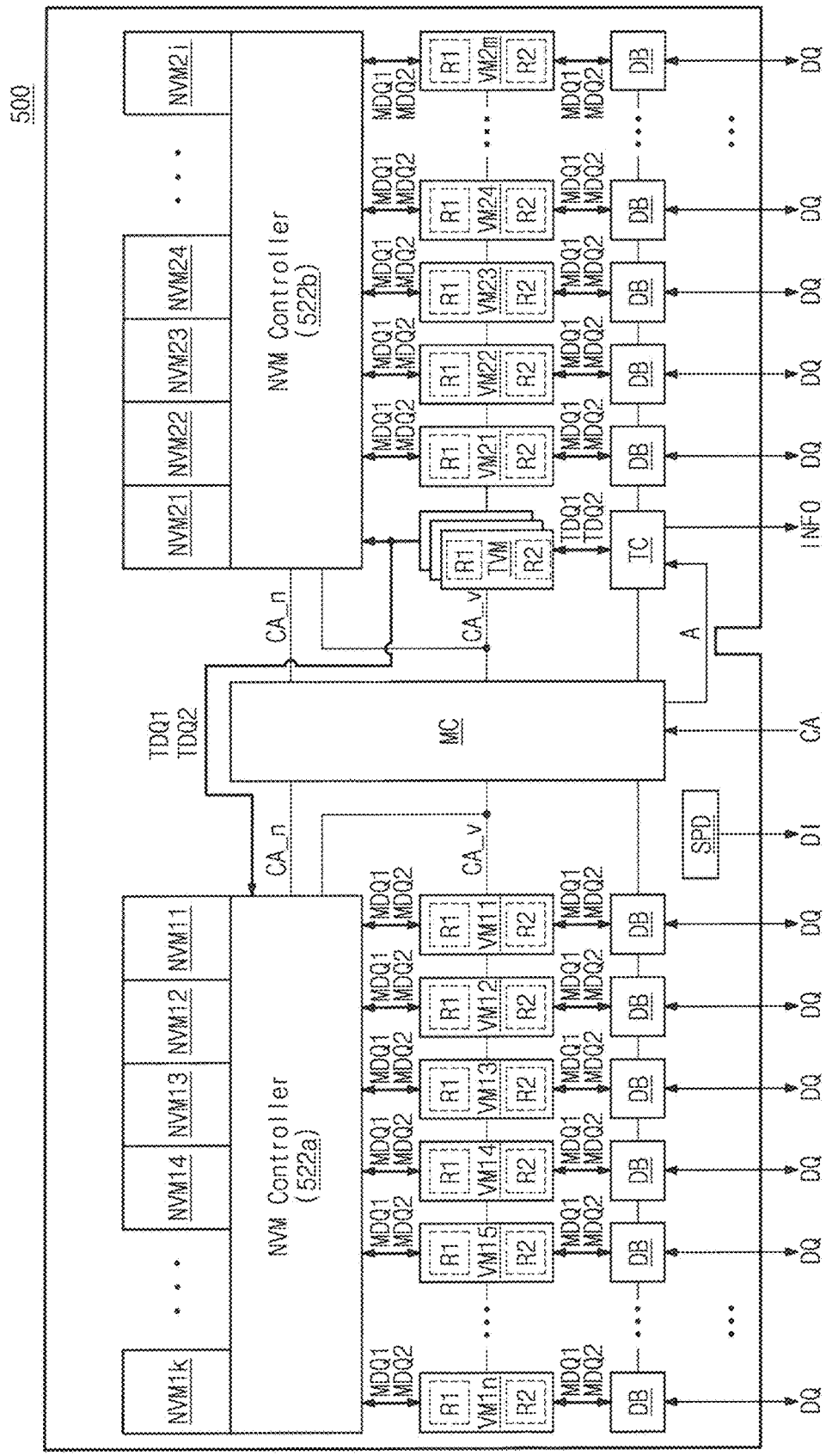
FIG. 18 is a block diagram illustrating a nonvolatile memory module of FIG. 2 according to other embodiments of the inventive concepts.

FIG. 18 is a block diagram illustrating the nonvolatile memory module 100 of FIG. 2, according to still another embodiment of the inventive concepts. Referring to FIGS. 1 and 18, a nonvolatile memory module 500 may include the module controller MC, a plurality of volatile memories VM11 to VM1n and VM21 to VM2m, first and second NVM controllers 522a and 522b, a plurality of nonvolatile memories NVM11 to NVM1k and NVM21 to NVM2i, a tag dedicated volatile memory TVM, the SPD, the plurality of data buffers DB, and a tag control circuit TC. For descriptive convenience, a detailed description of the above-described elements is omitted. In some embodiments, the nonvolatile memory module 500 of FIG. 18 may have an LRDIMM structure.

In the plurality of volatile memories VM11 to VM1n and VM21 to VM2m, each of the volatile memories VM11 to VM1n may be configured to share the first and second memory data lines MDQ1 and MDQ2 with the first NVM controller 522a. Each of the remaining volatile memories VM21 to VM2m may be configured to share the first and second memory data lines MDQ1 and MDQ2 with the second NVM controller 522b. Each of the plurality of volatile memories VM11 to VM1n and VM21 to VM2m may be configured to share the first and second memory data lines MDQ1 and MDQ2 with a corresponding one of the plurality of data buffers DB. Each of the plurality of volatile memories VM11 to VM1n and VM21 to VM2m may include the first region R1 and the second region R2.

In the plurality of nonvolatile memories NVM11 to NVM1k and NVM21 to NVM2i, the nonvolatile memories NVM11 to NVM1k may be configured to operate in response to control of the first NVM controller 522a. The remaining nonvolatile memories NVM21 to NVM2i may be configured to operate in response to control of the second NVM controller 522b.

The tag dedicated volatile memory TVM may be configured to share the first and second tag data lines TDQ1 and TDQ2 with the module controller MC, the first NVM controller 522a, and the second NVM controller 522b.

In some embodiments, each of elements illustrated in FIG. 18 may be implemented with a plurality of semiconductor chips, and at least some of the semiconductor chips may be implemented in one package. For example, each of the plurality of volatile memories VM11 to VM1n and VM21 to VM2m, the plurality of nonvolatile memories NVM11 to NVM1k and NVM21 to NVM2i, the first NVM controller 522a, and the second NVM controller 522b may be implemented with separate semiconductor chips. Some of the plurality of volatile memories VM11 to VM1n and VM21 to VM2m, the plurality of nonvolatile memories NVM11 to NVM1k and NVM21 to NVM2i, the first NVM controller B522a, and the second NVM controller 522b may be implemented in one package.

For example, some (e.g., VM11 to VM1n) of the plurality of volatile memories VM11 to VM1n and VM21 to VM2m may be implemented in one package, and the NVM controller 522a and some (e.g., NVM11 to NVM1k) of the plurality of nonvolatile memories NVM11 to NVM1k and NVM21 to NVM2i may be implemented in another package.

In some embodiments, the tag dedicated volatile memory TVM may include a plurality of semiconductor chips. For example, the tag dedicated volatile memory TVM may include a plurality of tag dedicated volatile memory chips, each of which stores the same tag, ECC, and dirty information. In this case, even though an operation of any one tag dedicated volatile memory chip is abnormal, it may be possible to write or output normally tag information, ECC information, and dirty information through another tag dedicated volatile memory. In some embodiments, a package in which the tag dedicated volatile memory TVM is included may be different from a package in which other elements are included. In some embodiments, the tag dedicated volatile memory TVM may be implemented with a package in which at least some of the other elements are included.

The tag control circuit TC may be configured to share the tag data line TDQ with the tag dedicated volatile memory TVM. That is, the tag control circuit TC may receive tags from the tag dedicated volatile memory TVM through the first and second tag data lines TDQ1 and TDQ2 or may send tags thereto.

Under control of the module controller MC, the tag control circuit TC may determine whether a cache hit or a cache miss is generated and may output the determination result as the cache information INFO. For example, the tag control circuit TC may receive the tag from the tag dedicated volatile memory TVM under control of the module controller MC. The tag control circuit TC may determine whether a cache miss or a cache hit is generated, by comparing a tag from the module controller MC with the address "A."

In some embodiments, the tag control circuit TC may be implemented with software or hardware, and the tag control circuit TC may be included in the module controller MC or may be included in each of the first and second NVM controllers 522a and 522b.

Figure 19:
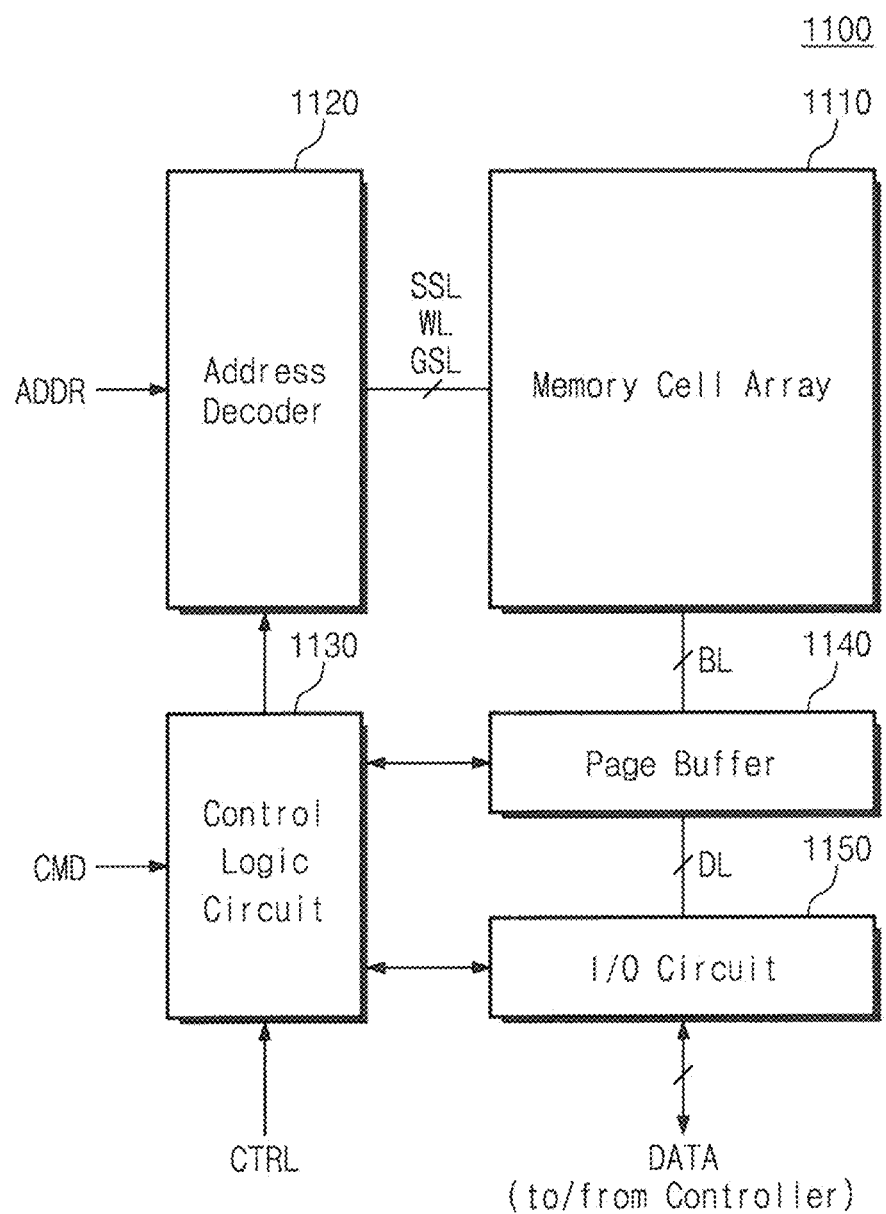
FIG. 19 is a block diagram illustrating a nonvolatile memory included in a nonvolatile memory module according to the inventive concepts.

FIG. 19 is a block diagram illustrating a nonvolatile memory included in the nonvolatile memory module according to the inventive concepts. Referring to FIG. 19, a nonvolatile memory 1100 may include a memory cell array 1110, an address decoder 1120, a control logic circuit 1130, a page buffer 1140, and an input/output (I/O) circuit 1150.

The memory cell array 1110 may include a plurality of memory blocks, each of which has a plurality of memory cells. The plurality of memory cells may be connected with a plurality of word lines WL. Each memory cell may be a single level cell (SLC) storing one bit or a multi-level cell (MLC) storing at least two bits.

The address decoder 1120 may receive and decode an address ADDR from the NVM controller 122 (refer to FIG. 2). In some embodiments, the address ADDR received from the NVM controller 122 may be a physical address indicating a physical location of a storage region of the nonvolatile memory 1100. The address decoder 1120 may select at least one of the word lines WL based on the decoded address and may drive the selected word line. Furthermore, the address decoder 1120 may select memory cells by driving string selection lines SSL and ground selection lines GSL.

The control logic circuit 1130 may control the address decoder 1120, the page buffer 1140, and the input/output circuit 1150 in response to a command CMD and a control logic CTRL received from the NVM controller 122 (refer to FIG. 2).

The page buffer 1140 is connected with the memory cell array 1110 through a plurality of bit lines BL and is connected with the input/output circuit 1150 through a plurality of data lines DL. The page buffer 1140 may read data stored in the memory cell array 1110 by sensing voltages of the plurality of bit lines BL. In some embodiments, the page buffer 1140 may adjust voltages of the plurality of bit lines BL based on data received through the plurality of data lines DL.

Under control of the control logic circuit 1130, the input/output circuit 1150 may receive data from the NVM controller 122 and may send the received data to the page buffer 1140. In some embodiments, the input/output circuit 1150 may receive data from the page buffer 1140 and may send the received data to the NVM controller 122.

In some embodiments, the NVM controller 122 may generate the address ADDR, the command CMD, and the control signal CTRL based on an NVM command/address CA_n from the module controller 110 (refer to FIG. 2).

Figure 20:
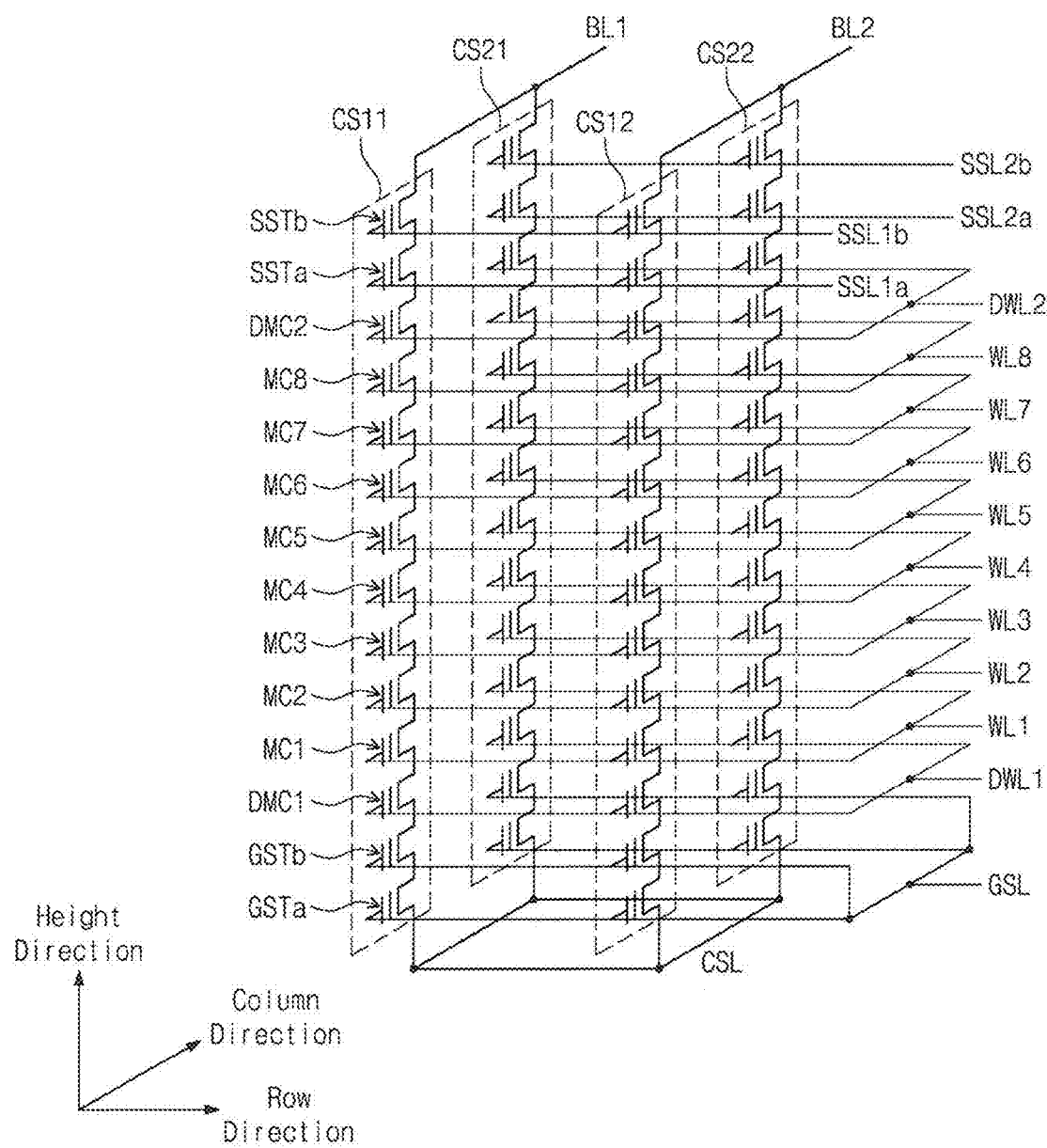
FIG. 20 is a circuit diagram illustrating a first memory block of memory blocks included in a nonvolatile memory of a nonvolatile memory module according to embodiments of the inventive concepts.

FIG. 20 is a circuit diagram illustrating a first memory block BLK1 of the memory blocks included in the nonvolatile memory of the nonvolatile memory module according to an embodiment of the inventive concepts. In some embodiments, a first memory block BLK1 having a three-dimensional structure will be described with reference to FIG. 20. However, embodiments of the inventive concepts are not limited thereto. For example, the remaining memory blocks may have a structure similar to, or different from, the first memory block BLK1.

Referring to FIG. 20, the first memory block BLK1 may include a plurality of cell strings CS11, CS12, CS21, and CS22. The cell strings CS11, CS12, CS21, and CS22 may be arranged along a row direction and a column direction and may form rows and columns.

Each of the cell strings CS11, CS12, CS21, and CS22 may include a plurality of cell transistors. For example, each of the cell strings CS11, CS12, CS21, and CS22 may include string selection transistor SSTa and SSTb, a plurality of memory cells MC1 to MC8, ground selection transistors GSTa and GSTb, and dummy memory cells DMC1 and DMC2. In some embodiments, each of the memory cells included in the cell strings CS11, CS12, CS21, and CS22 may be a charge trap flash (CTF) memory cell.

The plurality of memory cells MC1 to MC8 may be serially connected and may be stacked in a direction perpendicular to a plane defined by the row direction and the column direction, that is, in a height direction. The string selection transistors SSTa and SSTb may be serially connected and may be disposed between the memory cells MC1 to MC8 and a bit line BL. The ground selection transistors GSTa and GSTb may be serially connected and may be disposed between the memory cells MC1 to MC8 and a common source line CSL.

In some embodiments, a first dummy memory cell DMC1 may be disposed between the memory cells MC1 to MC8 and the ground selection transistors GSTa and GSTb. In some embodiments, a second dummy memory cell DMC2 may be disposed between the memory cells MC1 to MC8 and the string selection transistors SSTa and SSTb.

The ground selection transistors GSTa and GSTb of the cell strings CS11 CS12, CS21, and CS22 may be connected in common to a ground selection line GSL. In some embodiments, ground selection transistors in the same row may be connected to the same ground selection line, and ground selection transistors in different rows may be connected to different ground selection lines. For example, the first ground selection transistors GSTa of the cell strings CS11 and CS12 in the first row may be connected to the first ground selection line, and the first ground selection transistors GSTa of the cell strings CS21 and CS22 in the second row may be connected to a second ground selection line.

In some embodiments, even though not illustrated in FIG. 20, ground selection transistors provided at the same height from a substrate (not shown) may be connected to the same ground selection line, and ground selection transistors provided at different heights may be connected to different ground selection lines. For example, the first ground selection transistors GSTa of the cell strings CS11, CS12, CS21, and CS22 may be connected to the first ground selection line, and the second ground selection transistors GSTb thereof may be connected to the second ground selection line.

Memory cells placed at the same height from the substrate or the ground selection transistors GSTa and GSTb may be connected in common to the same word line, and memory cells placed at different heights therefrom may be connected to different word lines. For example, memory cells MC1 to MC8 of the cell strings CS11, CS12, CS21, and CS22 may be connected to first to eighth word lines WL1 to WL8, respectively.

The first memory block BLK1 illustrated in FIG. 20 may be an example embodiment of the inventive concepts, but embodiments of the inventive concepts are not limited thereto. For example, the number of cell strings may increase or decrease, and the number of rows of cell strings and the number of columns of cell strings may increase or decrease according to the number of cell strings. In the first memory block BLK1, the number of cell strings (GST, MC, DMC, SST, or the like) may increase or decrease, and a height of the first memory block BLK1 may increase or decrease according to the number of cell transistors. Furthermore, the number of lines (GSL, WL, DWL, SSL, etc.) connected with cell transistors may increase or decrease according to the number of cell transistors.

In some embodiments, the nonvolatile memory according to embodiments of the inventive concepts may not be limited to the above-described configuration. In some embodiments, the nonvolatile memory may include a three-dimensional memory array. The 3-dimensional memory array may be monolithically formed in one or more physical level(s) of a memory cell array having an active area arranged on a circuit related on a silicon substrate and an operation of memory cells. The circuit related on an operation of memory cells may be located in a substrate or on a substrate. A term "monolithically" may mean that layers of levels in a 3-dimensional array are directly deposited on layers of a lower level in the 3-dimensional array.

According to embodiments of the inventive concepts, the 3-dimensional memory array may have a vertical-directional characteristic, and may include vertical NAND strings in which at least one memory cell is located on another memory cell. The at least one memory cell may comprise a charge trap layer. Each vertical NAND string may include at least one select transistor located over memory cells. At least one selection transistor may have the same structure as memory cells, and be monolithically formed together with memory cells.

The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; 8,559,235; and US Pat. Pub. No. 2011/0233648.

Figure 21:
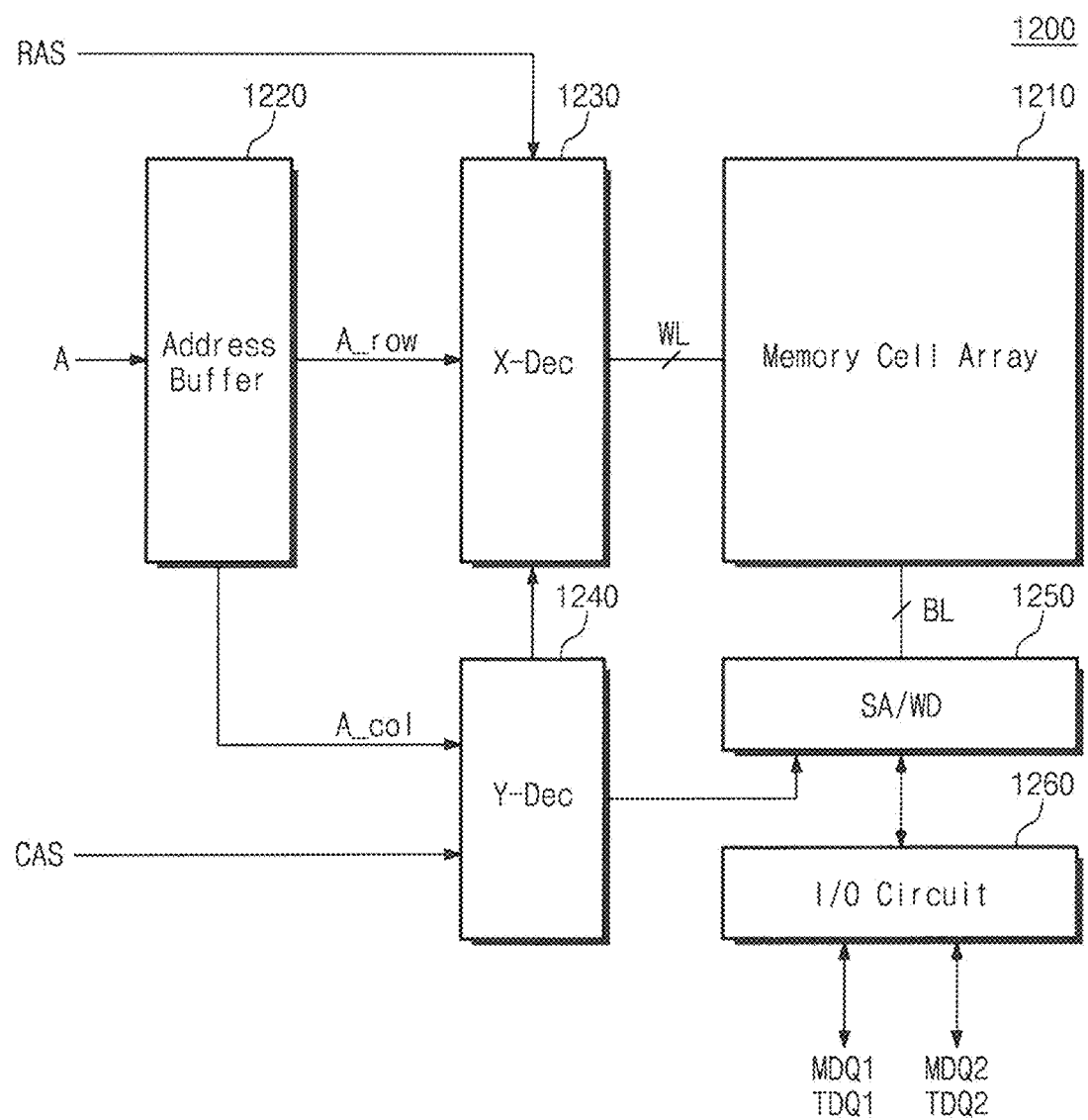
FIG. 21 is a block diagram illustrating a volatile memory of a nonvolatile memory module according to embodiments of the inventive concepts.

FIG. 21 is a block diagram illustrating a volatile memory of the nonvolatile memory module according to embodiments of the inventive concepts. Referring to FIG. 21, a volatile memory 1200 may include a memory cell array 1210, an address buffer 1220, a row decoder (X-decoder) 1230, a column decoder (Y-decoder) 1240, a sense amplifier and write driver 1250, and an input/output circuit 1260.

The memory cell array 1210 includes a plurality of memory cells, which are connected with a plurality of word lines WL and a plurality of bit lines BL. The plurality of memory cells may be located at intersections of the word lines WL and the bit lines BL, respectively. In some embodiments, each of the plurality of memory cells may include a storage capacitor and an access transistor.

The address buffer 1220 may receive and temporarily store an address "A" from the module controller 110 (refer to FIG. 2). In some embodiments, the address buffer 1220 may provide a row address A_row of the received address "A" to the X-decoder 1230 and may provide a column address A_col thereof to the Y-decoder 1240.

The X-decoder 1230 may be connected to the memory cell array 1210 through the word lines WL. The X-decoder 1230 may activate at least one, which corresponds to the row address A_row, from among the plurality of word lines WL in response to a row address strobe signal RAS from the module controller 110.

The Y-decoder 1240 may receive the column address A_col from the address buffer 1220. When a column address strobe signal CAS is received, the Y-decoder 1240 may control the sense amplifier and write driver 1250 based on the column address A_col.

The sense amplifier and write driver 1250 may be connected to the memory cell array 1210 through the plurality of bit lines BL. The sense amplifier and write driver 1250 may sense a voltage change of each bit line of the plurality of bit lines BL. In some embodiments, the sense amplifier and write driver 1250 may adjust voltages of the plurality of bit lines BL based on data received from the input/output circuit 1260.

The input/output circuit 1260 may receive data from the sense amplifier and write driver 1250 and may output the received data through the first memory data lines MDQ1, the first tag data lines TDQ1, the second memory data lines MDQ2, and/or the second tag data lines TDQ2. In some embodiments, the input/output circuit 1260 may receive data through the first memory data lines MDQ1, the first tag data lines TDQ1, the second memory data lines MDQ2, and/or the second tag data lines TDQ2 and may send the received data to the sense amplifier and write driver 1250.

In some embodiments, in a structure described with reference to FIGS. 2, 15, and 16, the volatile memory 1200 may be connected to the first memory data lines MDQ1, the first tag data lines TDQ1, the second memory data lines MDQ2, and the second tag data lines TDQ2. In a structure described with reference to FIGS. 17 and 18, the volatile memory 1200 may be connected to the first memory data lines MDQ1 and the second memory data lines MDQ1 or to the first tag data lines TDQ1 and the second tag data lines TDQ2.

In some embodiments, the address "A" may be the VM command/address CA_v provided from the module controller 110 (refer to FIG. 2). The row address strobe signal RAS and the column address strobe signal CAS may be signals that are included in the VM command/address CA_v provided from the module controller 110.

Figure 22:
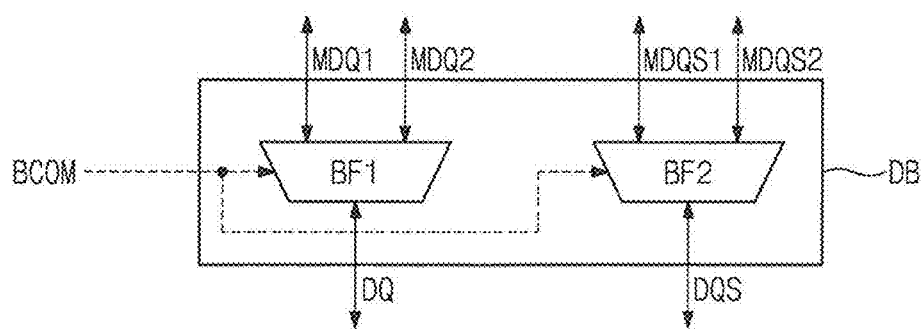
FIG. 22 is a block diagram illustrating a data buffer according to embodiments of the inventive concepts.

FIG. 22 is a block diagram illustrating the data buffer DB according to embodiments of the inventive concepts. Referring to FIG. 22, the data buffer DB may include first and second buffer multiplexers BF1 and BF2.

The first buffer multiplexer BF1 may connect the data lines DQ to the first memory data lines MDQ1 or the second memory data lines MDQ2 in response to a buffer command BCOM from the module controller 10 (refer to FIG. 2). The first buffer multiplexer BF1 may store and buffer data received through the data lines DQ, the first memory data lines MDQ1, or the second memory data lines MDQ2.

The second buffer multiplexer BF2 may connect the data strobe lines DQS to the first memory data strobe lines MDQS1 or the second memory data strobe lines MDQS2 in response to the buffer command BCOM from the module controller 110 (refer to FIG. 2).

Figure 23:
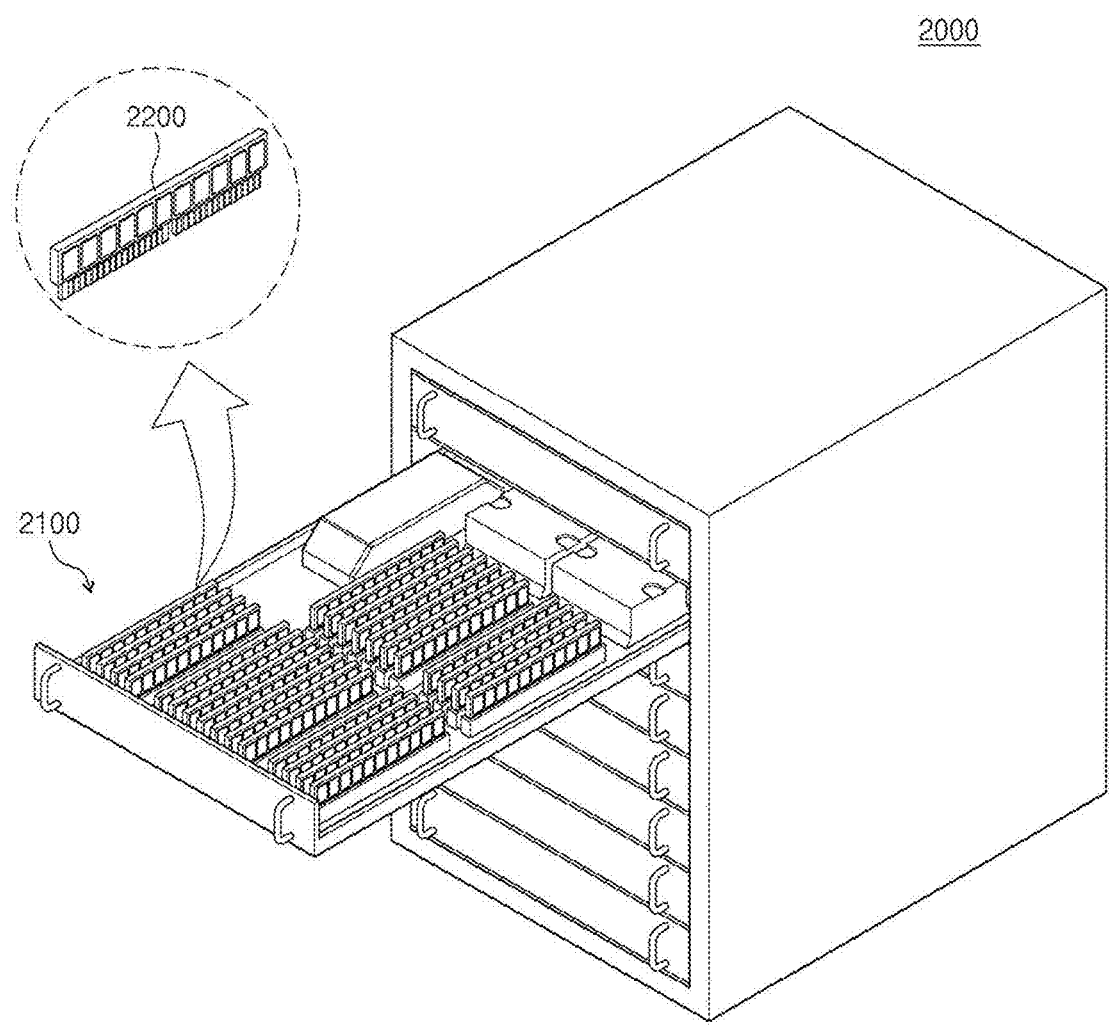
FIG. 23 is a drawing illustrating a server system to which a nonvolatile memory system according to embodiments of the inventive concepts is applied.

FIG. 23 is a drawing illustrating a server system 2000 to which the nonvolatile memory system according to an embodiment of the inventive concepts is applied. Referring to FIG. 23, a server system 2000 may include a plurality of server racks 2100. Each of the server racks 2100 may include a plurality of nonvolatile memory modules 2200. The nonvolatile memory modules 2200 may be directly connected with processors that are respectively included in the server racks 2100. For example, the nonvolatile memory modules 2200 may have the form of a dual in-line memory module (DIMM) and may be mounted in a DIMM socket electrically connected with a processor so as to communicate with the processor. In some embodiments, the nonvolatile memory modules 2200 may be used as storage of the server system 2000. In some embodiments, each of the nonvolatile memory modules 2200 may be a nonvolatile memory module described with reference to FIGS. 1 to 22.

Figure 24:
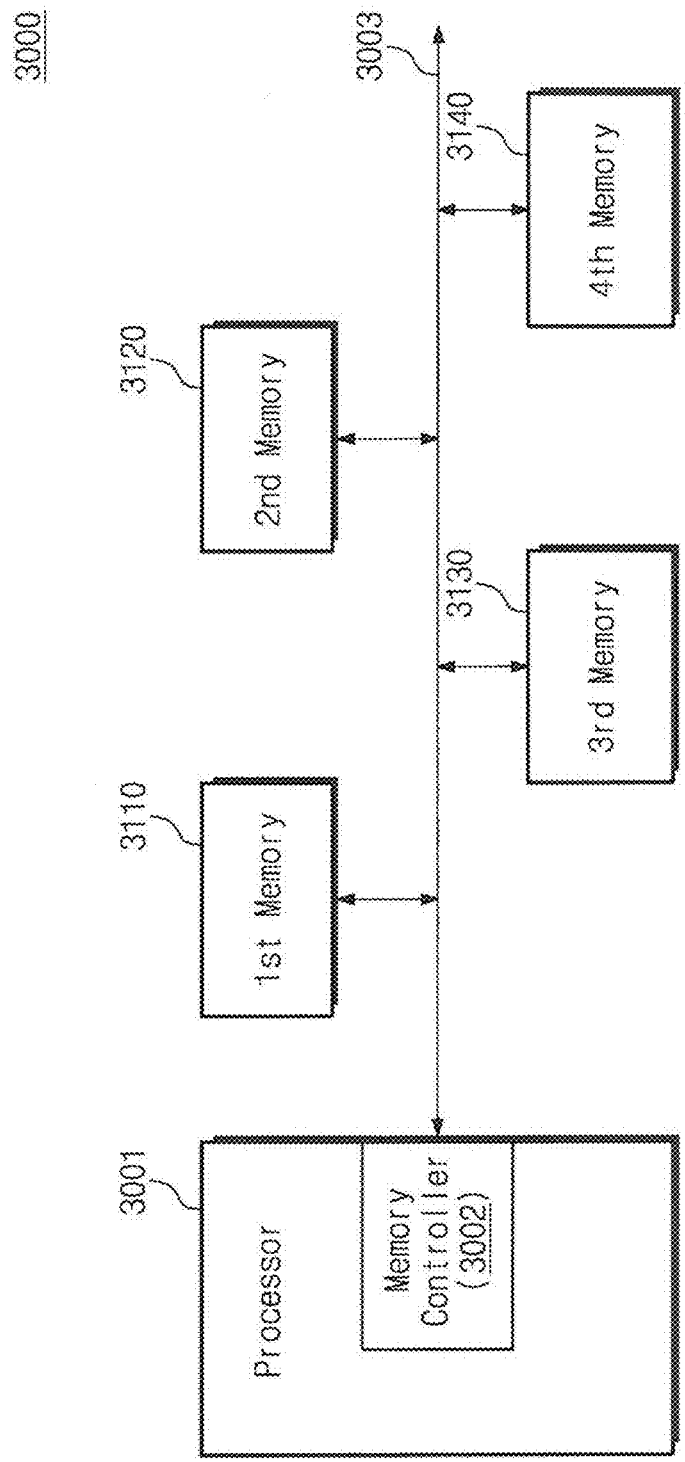
FIG. 24 is a block diagram illustrating a user system to which the nonvolatile memory module according to embodiments of the inventive concepts is applied.

FIG. 24 is a block diagram illustrating a user system 3000 to which the nonvolatile memory module according to embodiments of the inventive concepts is applied. Referring to FIG. 24, the user system 3000 may include a processor 3001 and a plurality of memories 3110 to 3140.

The processor 3001 may include a memory controller 3002. The memory controller 3002 may communicate with the memories 3110, 3120, 3130, and/or 3140 through one bus 3003. In some embodiments, the bus 3003 may include dedicated buses that are respectively connected with the plurality of memories 3110 to 3140 or a shared bus shared by the plurality of memories 3110 to 3140. In some embodiments, the bus 3003 may include at least one of the data lines DQ, the first memory data lines MDQ1, the second memory data lines MDQ2, the first tag data lines TDQ1, and the first tag data lines TDQ2 described with reference to FIGS. 1 to 22.

In some embodiments, at least some of the plurality of memories 3110 to 3140 may be nonvolatile memory modules described with reference to FIGS. 1 to 22 or may operate according to operation methods described with reference to FIGS. 1 to 22.

In some embodiments, at least some of the plurality of memory modules 3110 to 3140 may include a nonvolatile memory, and the remaining memory modules thereof may include a volatile memory. A memory module including a volatile memory may be used as a cache memory of a memory module including a nonvolatile memory. That is, as described with reference to FIGS. 1 to 22, some of the plurality of memory modules 3110 to 3140 may be used as a main memory of the user system 3000, and the remaining memory modules thereof may be used as a cache memory. Memories used as a cache memory may be a volatile memory described with reference to FIGS. 1 to 22 and/or may operate the same as a volatile memory described with reference to FIGS. 1 to 22.

In some embodiments, the memory controller 3002 may be a memory controller or a controller described with reference to FIGS. 1 to 22 and/or may operate the same as a memory controller described with reference to FIGS. 1 to 22.

As used herein, the singular terms "a," "an," and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. It will be further understood that the terms "comprises," "comprising," "includes," and/or "including", when used herein, specify the presence of stated features, integers, steps, operations, elements, and/or components, but do not preclude the presence or addition of one or more other features, integers, steps, operations, elements, components, and/or groups thereof.

Example embodiments of aspects of the present inventive concepts explained and illustrated herein include their complementary counterparts. The same reference numerals or the same reference designators denote the same elements throughout the specification.

While such terms as "first," "second," etc., may be used to describe various components, such components must not be limited to the above terms. The above terms are used only to distinguish one component from another. For example, a first component discussed below could be termed a second component, and similarly, a second component may be termed a first component without departing from the teachings of this disclosure.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which these inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The operations of all methods described herein can be performed in any suitable order unless otherwise indicated herein or otherwise clearly contradicted by context. The inventive concepts are not limited to the described order of the operations. For example, two consecutively described processes may be performed substantially at the same time or performed in an order opposite to the described order.

Embodiments of the inventive concepts provide a nonvolatile memory module having a great capacity and high performance by using a nonvolatile memory device and a volatile memory device. In particular, the volatile memory device may form a set associative cache memory, which has two or more ways, with respect to the nonvolatile memory device. This may mean that the performance of the nonvolatile memory module is improved and a manufacturing cost thereof is reduced.

While the inventive concepts have been described with reference to example embodiments, it will be apparent to those skilled in the art that various changes and modifications may be made without departing from the spirit and scope of the inventive concepts. Therefore, it should be understood that the above embodiments are not limiting, but illustrative.

What is claimed is:

1. A nonvolatile memory module comprising:
a nonvolatile memory device;
a nonvolatile memory controller configured to control the nonvolatile memory device;
a volatile memory device configured as a cache memory of the nonvolatile memory device; and
a module controller configured to receive a module command and a module address from an external device external to the nonvolatile memory module and to send a volatile memory command and a volatile memory address to the volatile memory device through a first bus and a nonvolatile memory command and a nonvolatile memory address to the nonvolatile memory controller through a second bus in response to the received module command and module address,
wherein the volatile memory device is configured to load two or more cache data on each of two or more memory data line groups and two or more tags on each of two or more tag data line groups in response to the volatile memory address.

2. The nonvolatile memory module of claim 1, further comprising:
a data buffer connected to the two or more memory data line groups, connected with the external device through data lines, and connecting the two or more memory data line groups and the data lines.

3. The nonvolatile memory module of claim 2, wherein, responsive to receiving a write command as the module command and a determination that a cache hit occurs with respect to one tag of the two or more tags, the data buffer loads write data received through the data lines on each of the two or more memory data line groups.

4. The nonvolatile memory module of claim 3, wherein the module controller is configured to inactivate a data mask signal corresponding to a first memory data line group, which is associated with the one tag of the cache hit, from among the two or more memory data line groups and to activate a data mask signal corresponding to a second memory data line group, which is not associated with the one tag of the cache hit, from among the two or more memory data line groups, and
wherein in response to the data mask signal and the volatile memory address, the volatile memory device is configured to store the write data loaded on the first memory data line group and to ignore the write data loaded on the second memory data line group.

5. The nonvolatile memory module of claim 3, wherein the nonvolatile memory controller is configured to write the write data loaded on one of the two or more memory data line groups in the nonvolatile memory device based on the nonvolatile memory address.

6. The nonvolatile memory module of claim 2, wherein, responsive to receiving a write command as the module command and a determination that a cache hit occurs with respect to one tag of the two or more tags, the data buffer is configured to:
responsive to the determination that a first memory data line group corresponds to the one tag of the cache hit, load write data received through the data lines on the first memory data line group from among the two or more memory data line groups; and
responsive to the determination that the second memory data line group does not correspond to the one tag of the cache hit, load cache data received through the second memory data line group on the second memory data line group from among the two or more memory data line groups.

7. The nonvolatile memory module of claim 6, wherein the volatile memory device is configured to store the write data loaded on the first memory data line group and the cache data loaded on the second memory data line group in response to the volatile memory address.

8. The nonvolatile memory module of claim 2, wherein responsive to receiving a read command as the module command and a determination that a cache hit occurs with respect to one tag of the two or more tags, the data buffer outputs cache data loaded on a memory data line group, which corresponds to the one tag of the cache hit, from among the two or more memory data line groups.

9. The nonvolatile memory module of claim 2, wherein, responsive to receiving a read command as the module command and a determination that a cache miss occurs with respect to each of the two or more tags, the nonvolatile memory controller is configured to read data from the nonvolatile memory device based on the nonvolatile memory address and to load the read data on each of the two or more memory data line groups.

10. The nonvolatile memory module of claim 9, wherein the module controller is configured to inactivate a data mask signal corresponding to a first memory data line group selected from among the two or more memory data line groups and to activate a data mask signal corresponding to a second memory data line group from among the two or more memory data line groups, and
wherein in response to the volatile memory address, the volatile memory device is configured to store the read data loaded on the first memory data line group and to ignore the data loaded on the second memory data line group.

11. The nonvolatile memory module of claim 9, wherein the data buffer is configured to output the data loaded on one of the two or more memory data line groups through the data lines.

12. The nonvolatile memory module of claim 2, wherein, responsive to receiving a read command as the module command and a determination that a cache miss occurs with respect to each of the two or more tags, the nonvolatile memory controller is configured to read data from the nonvolatile memory device based on the nonvolatile memory address and to load the read data on a first memory data line group of the two or more memory data line groups.

13. The nonvolatile memory module of claim 12, wherein the data buffer is configured to load cache data on a second memory data line group of the two or more memory data line groups, and
wherein the volatile memory device is configured to store the read data loaded on the first memory data line group and the cache data loaded on the second memory data line group.

14. The nonvolatile memory module of claim 1, wherein the module controller is connected to the tag data line groups and configured to determine a cache miss or a cache hit by comparing the two or more tags loaded on the tag data line groups with the volatile memory address.

15. A nonvolatile memory module comprising:
a nonvolatile memory device;
a nonvolatile memory controller configured to control the nonvolatile memory device;
a volatile memory device configured as a cache memory of the nonvolatile memory device;
a module controller configured to receive a module command and a module address from an external device external to the nonvolatile memory module and to send a volatile memory command and a volatile memory address to the volatile memory device through a first bus and a nonvolatile memory command and a nonvolatile memory address to the nonvolatile memory controller through a second bus in response to the received module command and module address; and
a data buffer configured to exchange data with the external device through data lines and exchange data with the nonvolatile memory controller and the volatile memory device through two or more memory data line groups,
wherein the volatile memory device is configured to communicate with the module controller and the nonvolatile memory controller through two or more tag data line groups corresponding to the two or more memory data line groups, respectively, and
wherein the volatile memory device forms a set associative cache memory, which has two or more ways, with respect to the nonvolatile memory device based on the two or more memory data line groups and the two or more tag data line groups.

16. A nonvolatile memory module comprising:
a nonvolatile memory device;
a volatile memory device connected to the nonvolatile memory device and configured to cache data for the nonvolatile memory device in a plurality of regions of the volatile memory device;
a module controller connected to the volatile memory device and configured to receive a module command and a module address, and responsive to receiving the module command and the module address, send a volatile memory command and a volatile memory address to the volatile memory device;
a plurality of tag data line groups connected to the volatile memory device, the module controller, and the nonvolatile memory device, respective ones of the tag data line groups corresponding to respective ones of the plurality of regions of the volatile memory device; and
a plurality of cache data line groups connected to the volatile memory device, the module controller, and the nonvolatile memory device, respective ones of the cache data line groups corresponding to respective ones of the plurality of regions of the volatile memory device,
wherein, responsive to receiving the volatile memory command and the volatile memory address, the volatile memory device is configured to:
transmit cache data from each one of the plurality of regions of the volatile memory device on corresponding ones of the plurality of cache data line groups, and
transmit tag data from each one of the plurality of regions of the volatile memory device on corresponding ones of the plurality of tag data line groups.

17. The nonvolatile memory module of claim 16, further comprising:
a plurality of data mask signal lines carrying a plurality of data mask signals and connected to the module controller, respective ones of the plurality of data mask signals corresponding to respective ones of the plurality of regions of the volatile memory device, wherein, for each region of the plurality of regions of the volatile memory device, the corresponding data mask signal is configured to be either active or inactive, and
wherein, responsive to the volatile memory command being a write command and responsive to a data mask signal of the plurality of data mask signals being inactive, the volatile memory device is further configured to store tag data from a respective one of plurality of tag data line groups and cache data from a respective one of the plurality of cache data line groups into a region of the plurality of regions of the volatile memory device that corresponds to the data mask signal.

18. The nonvolatile memory module of claim 17, wherein the module controller is further configured to:
inactivate a data mask signal of the plurality of data mask signals responsive to a determination that a cache hit is present for a region of the plurality of regions of the volatile memory device that corresponds to the data mask signal; and
activate the data mask signal of the plurality of data mask signals responsive to a determination that a cache hit is not present for the region of the plurality of regions of the volatile memory device that corresponds to the data mask signal.

19. The nonvolatile memory module of claim 16, further comprising:
a data buffer connected to the plurality of tag data line groups and the plurality of cache data line groups and configured to:
store respective tag data values provided to the data buffer from the plurality of tag data line groups;
store respective cache data values provided to the data buffer from the plurality of cache data line groups; and
responsive to a determination that a cache hit is not present for a region of the plurality of regions of the volatile memory device that corresponds to a cache data line group and a tag data line group, load a previously stored cache data value from the cache data line group onto the cache data line group and a previously stored tag value from the tag data line group onto the tag data line group.

20. The nonvolatile memory module of claim 19, wherein, responsive to the volatile memory command being a write command, the volatile memory device is further configured to store tag data from a respective one of plurality of tag data line groups and cache data from a respective one of the plurality of cache data line groups into a corresponding region of the plurality of regions of the volatile memory device.

* * * * *